United States Patent [19]
Yamagata et al.

[11] Patent Number: 6,163,493
[45] Date of Patent: Dec. 19, 2000

[54] SEMICONDUCTOR INTEGRATED CIRCUIT DEVICE WITH LARGE INTERNAL BUS WIDTH, INCLUDING MEMORY AND LOGIC CIRCUIT

[75] Inventors: Tadato Yamagata; Makoto Hatakenaka; Shigeki Tomishima; Akira Yamazaki, all of Hyogo, Japan

[73] Assignee: Mitsubishi Denki Kabushiki Kaisha, Tokyo, Japan

[21] Appl. No.: 09/208,492

[22] Filed: Dec. 10, 1998

[30] Foreign Application Priority Data

Apr. 30, 1998 [JP] Japan .................................. 10-120869
Jul. 30, 1998 [JP] Japan .................................. 10-215447

[51] Int. Cl.$^7$ ...................................................... G11C 7/00
[52] U.S. Cl. ...................................... 365/226; 365/230.06
[58] Field of Search ............................. 365/226, 230.06, 365/230.08, 189.05

[56] References Cited

U.S. PATENT DOCUMENTS 5,652,730  7/1997  Kono et al. .............................. 365/226
5,789,808  8/1998  Yamasaki et al. ....................... 257/693
5,822,264  10/1998 Tomishima et al. ..................... 365/222
5,917,765  6/1999  Morishita et al. ....................... 365/201

FOREIGN PATENT DOCUMENTS 8-212185   8/1996   Japan .

OTHER PUBLICATIONS

"A Multimedia 32b RISC Microprocessor with 16Mb DRAM" T. Shimizu et al., ISSCC 96, Feb. 1996, pp. 216–217.
"A Configurable DRAM Macro Design for 2112 Derivative Organizations to be Synthesized Using a Memory Generator", T. Yabe et al., ISCCC 98, Feb. 1998, pp. 72–73.

*Primary Examiner*—Son T. Dinh
*Assistant Examiner*—Anh Phung
*Attorney, Agent, or Firm*—McDermott, Will & Emery

[57] ABSTRACT

A first internal power supply circuit receiving an external power supply voltage for generating a first internal power supply voltage and a second internal power supply circuit receiving the external power supply voltage for generating a second internal power supply voltage are provided within a DRAM. A sense amplifier operates by the first internal power supply voltage. A write driver and a GIO line precharge circuit operate by the second internal power supply voltage. A peripheral circuit operates by the external power supply voltage. As a result, the sense amplifier and the peripheral circuit will not be affected by the operation of the write driver and the GIO line precharge circuit.

15 Claims, 17 Drawing Sheets

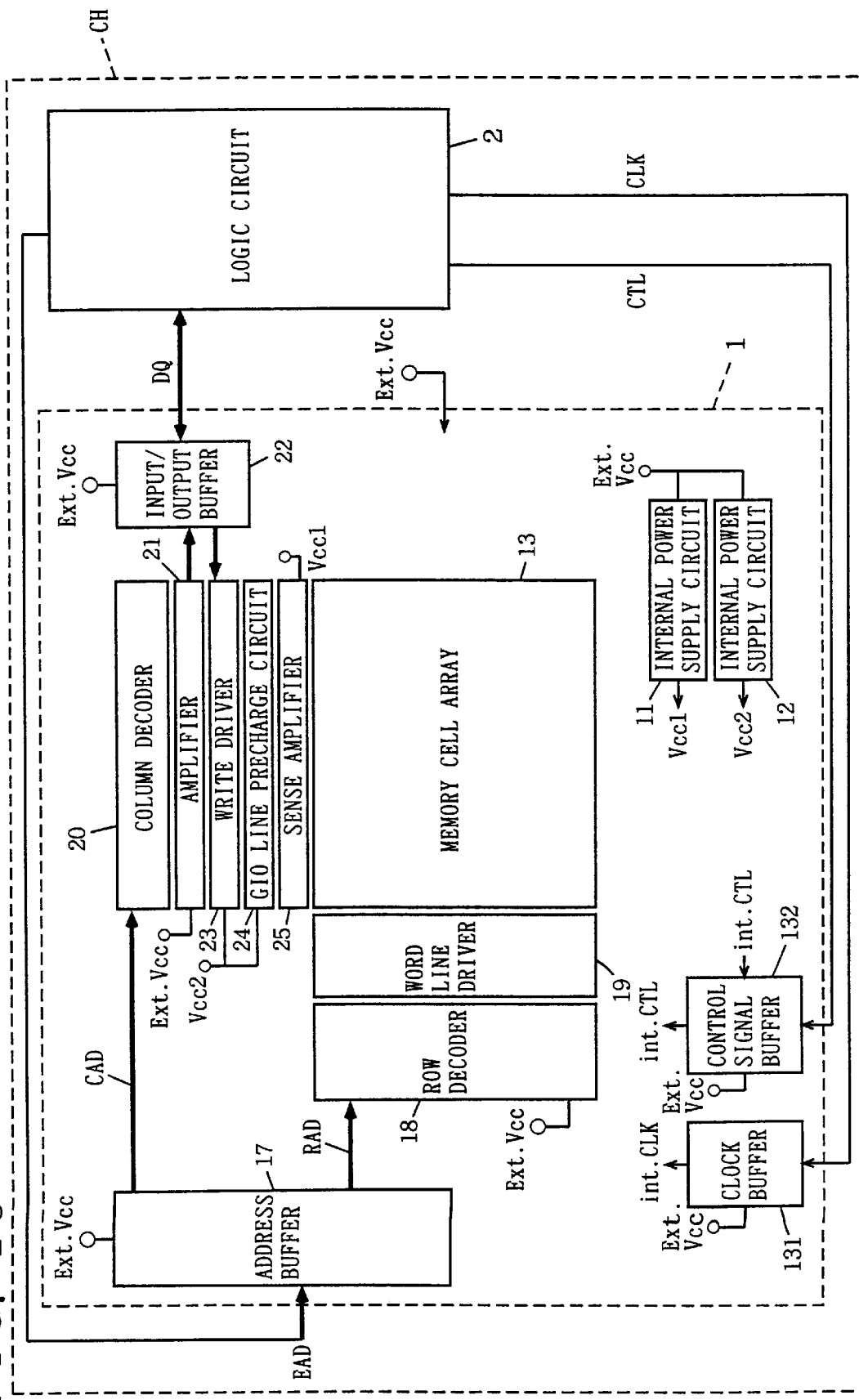
F I G. 1 9

SEMICONDUCTOR INTEGRATED CIRCUIT DEVICE WITH LARGE INTERNAL BUS WIDTH, INCLUDING MEMORY AND LOGIC CIRCUIT

BACKGROUND OF THE INVENTION

1. Field of the Invention

The present invention relates to semiconductor integrated circuit devices, and more particularly, to an embedded DRAM (Dynamic Random Access Memory) with an extremely large internal bus width.

2. Description of the Background Art

As microminiaturization of semiconductor memory devices continues to advance these few years, the research and development of a system LSI having a DRAM and a logic circuit both on one chip are now implemented intensively. One feature of such a DRAM/logic mounted chip is that the data transfer rate between the DRAM and the logic circuit can be improved significantly since an extremely larger internal bus width between the DRAM and the logic circuit can be implemented by usage of an interconnection layer on the chip than the case where a DRAM chip and a logic chip are mounted on a board. Here, "a large internal bus width" implies that many data can be read or written at the same time with respect to the memory cell array in the DRAM. More specifically, from the structural view of the memory cell array, many global input/output lines arranged in the memory cell array region can be activated simultaneously to transfer many data at one time through the plurality of global input/output lines.

A DRAM generally has an internal bus width of approximately 32–64 bits. Accordingly, approximately 32–64 pairs of global input/output lines are aligned. In contrast, the DRAM of a DRAM/logic mounted chip has an internal bus width of approximately 128–256 bits. It is said that the internal bus width will be increased up to approximately 1024–2048 bits in the future. Therefore, a number of global input/output lines corresponding to the increased bus width will be required.

A global input/output line is a transfer path of read/write data. In general, a write driver, a global input/output line precharge circuit, an amplifier, and the like are provided for each global input/output line.

When the internal bus width is small as in a normal DRAM, the power consumed by these circuits is small. As shown in FIG. 27, an internal power supply voltage Vcc1 is supplied to write driver 23 and global input/output line precharge circuit 24 from an internal power supply circuit 101 common to other circuitry such as a sense amplifier 25 and a peripheral circuit 90. Recent DRAMs generally include an internal power supply circuit (VDC: Voltage-Down Converter) in the chip from the standpoint of reducing power consumption and ensuring the reliability.

In an embedded memory (DRAM)/logic LSI, there is the tendency to reduce the thickness of the gate oxide film of the transistor to ensure sufficient operation speed of the transistor in the logic region. In order to use a transistor of the same size in the memory cell of a DRAM under the gate array structure, the power supply of the memory cell array, i.e., the voltage level of the power supply for operating the sense amplifier must be reduced from the standpoint of ensuring the reliability.

Reduction in the voltage level of the memory cell array power source allows power consumption to be reduced in the memory cell array. The effect of reducing the power consumption in a memory of a large capacity is great.

For the purpose of carrying out data input/output efficiently taking into account the increase in the capacity of the memory, a DRAM of a hierarchical I/O line (input/output line) structure and a DRAM directed to multi-bits are now being developed.

FIG. 28 shows an entire structure of a DRAM 500 of a hierarchical I/O line structure.

Referring to FIG. 28, DRAM 500 includes four memory mats 501, each of 16M bits, and a peripheral circuit 505.

FIG. 29 shows in detail the structure of memory mat 501. Referring to FIG. 29, memory mat 501 is further divided into subblocks 505 by a sense amplifier band 504 in which sense amplifiers are arranged and by a shunt region 502 of a word line. Each subblock 505 includes 32K memory cells connected to 256 word lines WL and 128 sense amplifiers. More specifically, memory mat 501 of 16 M bits is divided into 16 regions by sense amplifier band 504 and shunt region 502.

Column select line CSL in memory mat 501 is selected by column decoder 510 provided at the end of memory mat 501. Column select line CSL is a signal line common to the memory cells having the same column address in memory mat 501. Column select line CSL is provided common to a plurality of subblocks, extending in the column direction.

FIG. 30 shows the I/O line structure of DRAM 500. Referring to FIG. 30, DRAM 500 includes a pair of local input/output lines LIO, /LIO provided for every two subblocks 505. In response to activation of column select line CSL, the data of a selected memory cell is amplified by a sense amplifier to be transmitted to local input/output line pair LIO, /LIO. Local input/output line pair LIO, /LIO is connected to a global input/output line pair GIO, /GIO by transfer gate 520. Data is read or written through global input/output line pair GIO, /GIO via a main amplifier and a write driver 530.

FIG. 31 shows in detail a structure of transfer gate 520. Transfer gate 520 includes transistors 521 and 522 connecting local input/output line pair LIO, /LIO and global input/output line pair GIO, /GIO, and receiving a subblock select signal BS at respective gates. Transistors 521 and 522 are rendered conductive in response to activation of bank select signal BS to transmit data between local input/output line pair LIO, /LIO and global input/output line pair GIO, /GIO.

By operating memory mat 501 independently for every group of subblocks 505 by a hierarchical I/O line structure by local input/output lines and main input/output lines, data can be input/output more efficiently.

The structure of a DRAM directed to multi-bits will be described hereinafter with reference to FIG. 32.

A multi-bit DRAM 600 includes a memory mat 501 divided into a plurality of subblocks 505. DRAM 600 further includes a column decoder 510 adjacent to memory mat 501, a word line driver 550, and a main amplifier block 560. Main amplifier 560 includes a plurality of main amplifiers.

In DRAM 600, column decoder 510 is provided next to row decoder 550 arranged at the end of memory mat 501. Column select line CSL is selected by column decoder 510. Column select line CSL extends above sense amplifier band 504 provided between subblocks in a direction parallel to word line WL. A pair of main input/output lines MIO and /MIO are provided as signal lines common to subblocks 505 adjacent in the column direction, and is connected to respective main amplifiers of main amplifier band 560 at the end of memory mat 501. A data read/write operation is carried out through main input/output line pair MIO, /MIO via a main amplifier.

FIG. 33 shows in detail the structure of DRAM 600. In subblock 505, the main input/output line pair includes, for example, 128 input/output line pairs MIO1, /MIO1–MIO128, /MIO128. According to this structure, each of main input/output line pairs MIO1, /MIO1–MIO128, /MIO128 is provided for every 4 pairs of bit lines BL and /BL in subblock 505. Each bit line pair B1, /BL is connected to sense amplifiers SA1–SA512, respectively, in sense amplifier band 504. Sense amplifiers SA1–SA512 amplify the data stored in the memory cell transmitted through bit line pair BL, /BL, and are connected to main input/output line pairs MIO1, /MIO–MIO128, /MIO128 via transmission gate pairs N1–N512. Transmission gates N1–N512 include an N type transistor having its gate connected to column select line CSL to connect a sense amplifier with a main input/output line pair.

In response to activation of column select line CSL, the 128 pairs of transmission gates are rendered conductive, whereby 128 bits of data can be input/output by one column select operation through main input/output line pairs MIO1, /MIO1–MIO128, MIO128.

Thus, the number of processed data per one column select operation can be increased in multi-bit DRAM 600 than for a conventional DRAM.

When there are a great number of global input/output lines as in the case of an embedded DRAM/logic LSI chip, the power consumed by write driver 23 and global input/output line precharge circuit 24 is particularly increased. This is because the power is consumed in the charge/discharge operation of the global input/output line in write driver 23 and in the precharge operation of the global input/output line in global input/output line precharge circuit 24. Therefore, when an internal power supply circuit common to other circuits such as sense amplifier 25 and peripheral circuit 90 is used for write driver 23 and global input/output line precharge circuit 24 as shown in FIGS. 20 and 21, the internal power supply voltage is reduced by the great current consumed in the operation of write driver 23 and global input/output line precharge circuit 24 to induce bouncing. This becomes the cause of erroneous operation of other circuits.

As mentioned above, the voltage level of power supply for the memory cell array must be reduced particularly in the above-described embedded DRAMs. If the voltage level of the power supply for the write driver that writes externally applied data is set equal to the power supply voltage level that drives the peripheral circuits such as a logic circuit and the like as in the conventional case, the following problem will be encountered.

The level of the power supply voltage of a write driver corresponds to the amplitude level of an I/O line. A great amplitude level of an I/O line implies that the time required for the equalize operation of an I/O line carried out prior to a data write/read operation becomes longer. Particularly for a data readout operation following a data write operation, the operation speed is rate-determined by the time of the equalize operation. This problem will become a bottleneck in increasing the operation speed of the DRAM.

In the above-described embedded DRAM, the number of data that can be processed at one time, i.e., the number of I/O lines rendered active, is significantly great since the data bus has a large width. The amplitude level of an I/O line greatly affects the power consumption of the entire DRAM.

If the voltage level of the memory cell array power supply is reduced, it will become difficult to form the transfer gate employed in the application of the hierarchical I/O line system in a DRAM only by the N type transistor as shown in FIG. 31. In accordance with reduction in the voltage level of the sense amplifier power supply, the voltage level corresponding to an H level of data becomes lower. Sufficient voltage level cannot be obtained in writing data of an H level with the transfer gate formed by only an N type transistor due to the drop of the threshold voltage of the N type transistor.

SUMMARY OF THE INVENTION

An object of the present invention is to provide a semiconductor integrated circuit device in which another circuit such as a sense amplifier or a peripheral circuit is not affected by an operation of a write driver or a global input/output line precharge circuit.

Another object of the present invention is to provide a semiconductor integrated circuit device including a word driver and a transfer gate that can accommodate various problems generated by reducing the voltage level of the memory cell array power supply, i.e., the sense amplifier power supply.

According to an aspect of the present invention, a semiconductor integrated circuit device includes a memory cell array, a first internal power supply circuit, a sense amplifier, a second internal power supply circuit, and a write driver. The memory cell array includes a plurality of memory cells arranged in rows and columns. The first internal power supply circuit receives an external power supply voltage to generate a first internal power supply voltage lower than the external power supply voltage. The sense amplifier receives the first internal power supply voltage to operate for amplifying a data signal read out from a memory cell in the memory cell array. The second internal power supply circuit receives the external power supply voltage to generate a second internal power supply voltage lower than the external power supply voltage. The write driver receives the second internal power supply voltage to operate for writing a data signal into a memory cell in the memory cell array.

According to the semiconductor integrated circuit device of the present aspect, the sense amplifier operates in response to the first internal power supply voltage from the first internal power supply circuit, and the write driver operates in response to the second internal power supply voltage from the second internal power supply circuit. Therefore, the sense amplifier will not receive any effect of power supply line noise induced by the consumed current of the write driver.

Preferably, the above semiconductor integrated circuit device includes a third internal power supply circuit, an address buffer, a row decoder, and a column decoder. The third internal power supply circuit receives the external power supply voltage to generate a third internal power supply voltage lower than the external power supply voltage. The address buffer receives the third internal power supply voltage to operate for generating a row address signal and a column address signal in response to an external address signal. The row decoder responds to a row address signal from the address buffer to select a row in the memory cell array. The column decoder responds to a column address signal from the address buffer to select a column in the memory cell array.

According to the above semiconductor integrated circuit device, the sense amplifier, the write driver, and the address buffer operate by receiving the first internal power supply voltage from the first internal power supply circuit, the second internal power supply voltage from the second internal power supply circuit, and the third internal power supply voltage from the third internal power supply circuit, respectively. Therefore, the address buffer is not affected by the power supply line noise induced by the consumed current of the write driver. Also, the third internal power supply voltage can be set to a value differing from those of the first and second internal power supply voltages for the purpose of improving the operating speed of the address buffer.

Preferably, the above semiconductor integrated circuit device includes a plurality of word lines arranged in rows, a plurality of bit line pairs arranged in columns, a local input/output line pair, a plurality of column select gates, a global input/output line pair, a transfer gate, and a precharge circuit. The plurality of column select gates are provided corresponding to the plurality of bit line pairs. Each column select gate is connected between a corresponding bit line pair and the local input/output line pair. The transfer gate is connected between the local input/output line pair and the global input/output line pair. The precharge circuit receives the second internal power supply voltage to operate for precharging the global input/output line pair.

In the above semiconductor integrated circuit device, the sense amplifier operates by receiving the first internal power supply voltage of the first internal power supply circuit, and the write driver and the precharge circuit operate by receiving the second internal power supply voltage from the second internal power supply circuit. Therefore, the sense amplifier will not be affected by the power supply line noise induced by the consumed current of the precharge circuit.

Preferably, the above semiconductor integrated circuit device includes a plurality of word lines arranged in rows, a plurality of bit line pairs arranged in columns, an input/output line pair, a plurality of column select gates, and a precharge circuit. The plurality of column select gates are provided corresponding to the plurality of bit line pairs. Each column select gate is connected between a corresponding bit line pair and input/output line pair. The precharge circuit receives the second internal power supply voltage to operate for precharging the input/output line pair.

In the above semiconductor integrated circuit device, the sense amplifier operates by the first internal power supply voltage of the first internal power supply circuit, and the write driver and the precharge circuit operate by the second internal power supply voltage of the second internal power supply circuit. Therefore, the sense amplifier will not be affected by the power supply line noise induced by the consumed current of the precharge circuit.

Preferably, the above semiconductor integrated circuit device includes a third internal power supply circuit, an address buffer, a row decoder, and a column decoder. The third internal power supply circuit receives the external power supply voltage to generate a third internal power supply voltage lower than the external power supply voltage. The address buffer receives the third internal power supply voltage to operate for generating a row address signal and a column address signal in response to an external address signal. The row decoder responds to a row address signal from the address buffer to select a row in the memory cell array. The column decoder responds to a column address signal from the address buffer to select a column in the memory cell array.

In the above semiconductor integrated circuit device, the sense amplifier, the write driver and precharge circuit, and the address buffer operate by receiving the first internal power supply voltage from the first internal power supply circuit, the second internal power supply voltage from the second internal power supply circuit, and the third internal power supply voltage from the third internal power supply circuit, respectively. Therefore, the address buffer will not be affected by the power supply line noise induced by the consumed current of the write driver and the precharge circuit. Also, the third internal power supply voltage can be set to a level differing from the levels of the first and second internal power supply voltages to improve the operating speed of the address buffer.

Preferably, the above semiconductor integrated circuit device further includes an address buffer, a row decoder, and a column decoder. The address buffer operates according to the external power supply voltage to generate a row address buffer and a column address buffer in response to an external address signal. The row decoder responds to a row address signal from the address buffer to select a row in the memory cell array. The column decoder responds to a column address signal from the address buffer to select a column in the memory cell array.

In the above semiconductor integrated circuit device, the sense amplifier, the write driver and precharge circuit, and the address buffer operate by receiving the first internal power supply voltage from the first internal power supply circuit, the second internal power supply voltage from the second internal power supply circuit, and the external power supply voltage, respectively. Therefore, the address buffer is not affected by the power supply line noise induced by the consumed current of the write driver and the precharge circuit.

According to another aspect of the present invention, a semiconductor integrated circuit device includes a memory cell array, first and second pads, a sense amplifier, and a write driver. The memory cell array includes a plurality of memory cells arranged in rows and columns. The sense amplifier is connected to the first pad to receive a voltage therefrom to operate for amplifying a data signal read out from a memory cell in the memory cell array. The write driver is connected to the second pad to receive a voltage therefrom to operate for writing a data signal into a memory cell in the memory cell array.

In the above semiconductor integrated circuit device, the sense amplifier receives the voltage from the first pad to operate, and the write driver receives the voltage from the second pad to operate. Therefore, the address buffer is not affected by the power supply line noise induced by the consumed current of the write driver.

Preferably, the above semiconductor integrated circuit device further includes a third pad, an address buffer, a row decoder, and a column decoder. The address buffer receives the voltage from the third pad to operate for generating a row address signal and a column address signal in response to an external address signal. The row decoder responds to a row address signal from the address buffer to select a row in the memory cell array. The column decoder responds to a column address signal from the address buffer to select a row in the memory cell array.

In the above semiconductor integrated circuit device, the sense amplifier receives the voltage from the first pad to operate, the write driver receives the voltage from the second pad to operate, and the address buffer receives the voltage from the third pad to operate. Therefore, the address buffer is not affected by the power supply line noise induced by the consumed current of the write driver.

Preferably, the above semiconductor integrated circuit device further includes a plurality of word lines arranged in rows, a plurality of bit line pairs arranged in columns, a local input/output line pair, a plurality of column select gates, a global input/output line pair, a transfer gate, and a precharge circuit. The plurality of column select gates are provided corresponding to the plurality of bit line pairs. Each column select gate is connected between a corresponding bit line pair and the local input/output line pair. The transfer gate is connected between the local input/output line pair and the global input/output line pair. The precharge circuit receives a voltage from the second pad to operate for precharging the global input/output line pair.

In the above semiconductor integrated circuit device, the sense amplifier receives the voltage from the first pad to operate, and the write driver and precharge circuit receive the voltage from the second pad to operate. Therefore, the sense amplifier will not be affected by the power supply line noise induced by the consumed current of the precharge circuit.

Preferably, the above semiconductor integrated circuit device further includes a plurality of word lines arranged in rows, a plurality of bit line pairs arranged in columns, an input/output line pair, a plurality of column select gates, and a precharge circuit. The plurality of column select gates are provided corresponding to the plurality of bit line pairs. Each column select gate is connected between a corresponding bit line pair and the input/output line pair. The precharge circuit receives the voltage from the second pad to operate for precharging the input/output line pair.

In the above semiconductor integrated circuit device, the sense amplifier receives the voltage from the first pad to operate, and the write driver and precharge circuit receive the voltage from the second pad to operate. Therefore, the sense amplifier will not be affected by the power supply line noise induced by the consumed current of the precharge circuit.

Preferably, the above semiconductor integrated circuit device further includes a third pad, an address buffer, a row decoder, and a column decoder. The address buffer receives the voltage from the third pad to operate for generating a row address signal and a column address signal in response to an external address signal. The row decoder responds to a row address signal from the address buffer to select a row in the memory cell array. The column decoder responds to a column address signal from the address buffer to select a column in the memory cell array.

In the above semiconductor integrated circuit device, the sense amplifier, the write driver and precharge circuit, and the address buffer operate by receiving the voltage from the first pad, the voltage from the second pad, and the voltage from the third pad, respectively. Therefore, the address buffer will not be affected by the power supply line noise induced by the consumed current of the write driver and the precharge circuit.

According to still another aspect of the present invention, a semiconductor integrated circuit device includes a memory cell array, a first internal power supply circuit, a sense amplifier, and a write driver.

The memory cell array includes a plurality of memory cells arranged in rows and columns. The first internal power supply circuit receives an external power supply voltage to generate a first internal power supply voltage lower than the external power supply voltage. The sense amplifier receives a first internal power supply voltage to operate for amplifying a data signal read out from a memory cell in the memory cell array. The write driver receives the first internal power supply voltage to operate for writing a data signal into a memory in the memory cell array.

According to the semiconductor integrated circuit device of the present aspect, the write driver operates receiving the first internal power supply voltage which is the power supply voltage of the sense amplifier. Therefore, the amplitude of the data signal can be reduced to allow reduction in power consumption. Also, the operating speed can be improved by virtue of reduction in the equalize time.

According to yet a further aspect of the present invention, a semiconductor integrated circuit device includes a memory cell array, a first internal power supply circuit, a second internal power supply circuit, a sense amplifier, a write driver, and a voltage balance circuit.

The memory cell array includes a plurality of memory cells arranged in rows and columns. The first internal power supply circuit receives an external power supply voltage to generate a first internal power supply voltage lower than the external power supply voltage. The second internal power supply circuit receives an external power supply voltage to generate a second internal power supply voltage lower than the external power supply voltage. The sense amplifier receives the first internal power supply voltage from the first internal power supply circuit to operate for amplifying a data signal read out from a memory cell of the memory cell array. The write driver receives the second internal power supply voltage from the second internal power supply circuit to write a data signal into a memory cell in a memory cell array. The voltage balance circuit renders the level of the second internal power supply voltage identical to the level of the first internal power supply voltage.

Preferably, in the semiconductor integrated circuit device of the present aspect, the voltage balance circuit includes a power supply line. The power supply line connects an output node of the first internal power supply circuit to an output node of the second internal power supply circuit.

In the semiconductor integrated circuit device of the present aspect, power supply voltage is applied to the write driver and the sense amplifier by the first and second internal power supply circuits generating a power supply voltage of the same level. Therefore, variation in the power supply voltage can be reduced.

Preferably, in the semiconductor integrated circuit device, the voltage balance circuit includes a reference voltage generation circuit and a signal line.

The reference voltage generation circuit generates a reference voltage signal corresponding to the first internal power supply voltage. The signal line transmits the reference voltage signal to the first and second internal power supply circuits.

In the semiconductor integrated circuit device, the write driver is supplied with a power supply voltage of a level identical to that of the power supply voltage of the sense amplifier by the second internal power supply circuit independent of the first internal power supply circuit. Therefore, variation in the power supply voltage can be further reduced.

Further preferably, the semiconductor integrated circuit device includes a plurality of word lines, a plurality of bit line pairs, a local input/output line pair, a plurality of column select gates, a global input/output line pair, and a transfer gate. The plurality of word lines are arranged in rows. The plurality of bit line pairs are arranged in columns. The column select gates are provided corresponding to the plurality of bit line pairs. Each column select gate is connected between a corresponding bit line pair and a local input/output line pair. The transfer gate includes a P type MOS transistor connected between a local input/output line pair and a global input/output line pair.

The P type MOS transistor includes one of a source and drain, the other of the source and drain, a gate, and a region right below the gate. The one of the source and drain is connected to one line of the local input/output line pair The other of the source and drain is connected to one line of the global input/output line pair. A select signal that establishes correspondence between a local input/output line pair and a global input/output line pair is supplied to the gate. The first internal power supply voltage is applied to the region right below the gate.

In the semiconductor integrated circuit device, the transfer gate includes a P type transistor having a region right below the gate to which the first internal power supply voltage is applied corresponding to the power supply voltage of the sense amplifier. Therefore, a sufficient voltage level corresponding to data of an H level can be obtained even when the level of the power supply voltage of the sense amplifier is reduced while employing a hierarchical I/O line structure.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 19 is a block diagram showing an entire structure of a system LSI according to a twelfth embodiment of the present invention.

DESCRIPTION OF THE PREFERRED EMBODIMENTS

Figure 1:
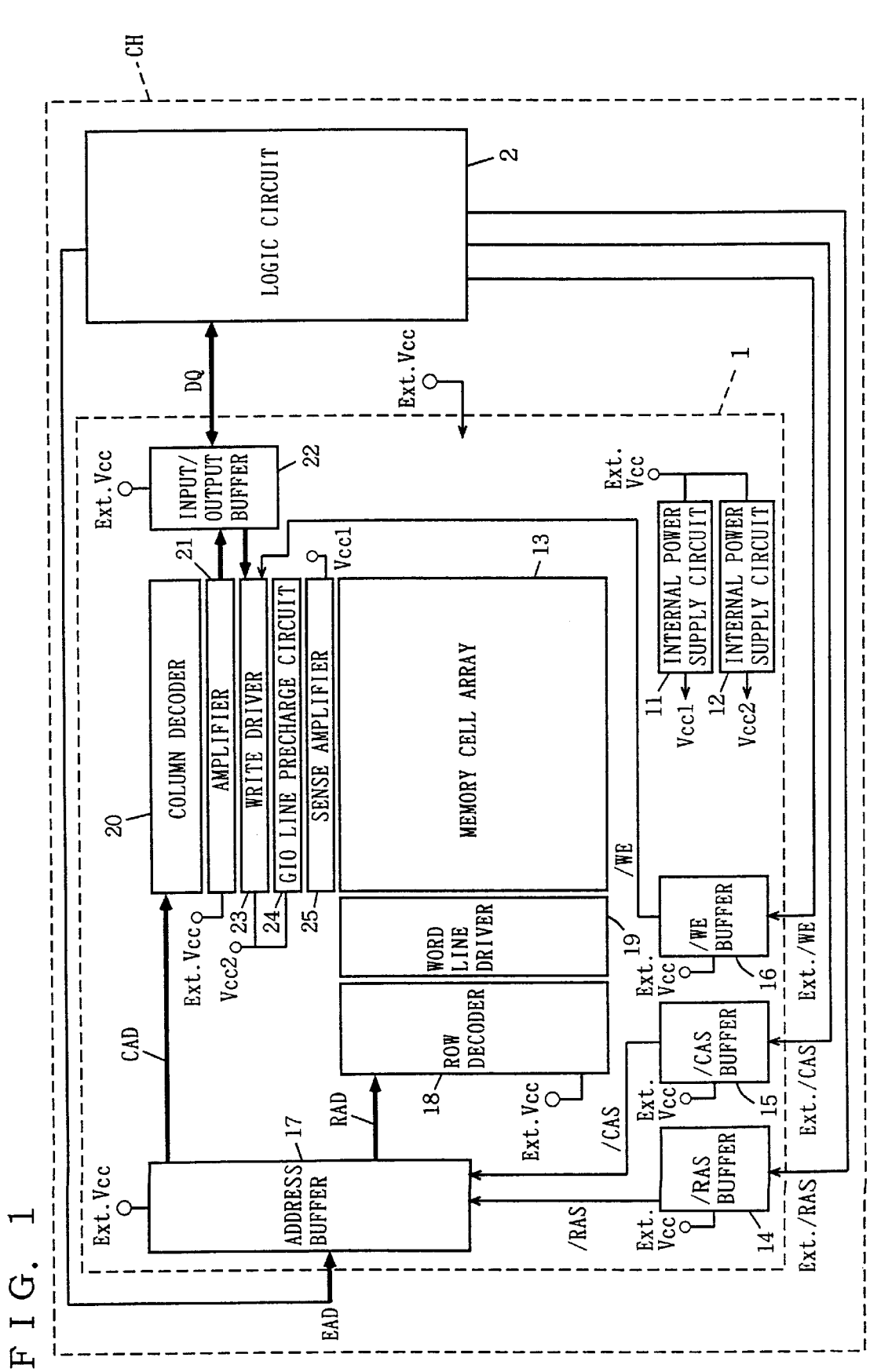
FIG. 1 is a block diagram showing an entire structure of a system LSI according to a first embodiment of the present invention.

Embodiments of the present invention will be described in detail hereinafter with reference to the drawings. In the drawings, identical or corresponding components have the same reference characters allotted, and their description will not be repeated.

First Embodiment

Referring to FIG. 1, a system LSI according to a first embodiment of the present invention includes a DRAM 1 and a logic circuit 2. DRAM 1 and logic circuit 2 are provided on the same chip CH. Input/output data DQ are transferred therebetween.

DRAM 1 includes internal power supply circuits 11 and 12, a memory cell array 13, a row address strobe (/RAS) buffer 14, a column address strobe (/CAS) buffer 15, a write enable (/WE) buffer 16, an address buffer 17, a row decoder 18, a word line driver 19, a column decoder 20, a global amplifier 21, an input/output buffer 22, a write driver 23, a global input/output line (GIO) precharge circuit 24, and a sense amplifier 25.

Internal power supply circuit 11 receives an external power supply voltage Ext.Vcc (for example 3.3 V) to generate an internal power supply voltage Vcc1 (for example 2.5 V) lower than external power supply voltage Ext.Vcc. Internal power supply circuit 12 receives external power supply voltage Ext.Vcc to generate an internal power supply voltage Vcc2 (for example 2.5 V) lower than external power supply voltage Ext.Vcc. Memory cell array 13 includes a plurality of memory cells arranged in rows and columns, a plurality of word lines (not shown) arranged in rows, and a plurality of bit line pairs (not shown) arranged in columns. /RAS buffer 14 operates by external power supply voltage Ext.Vcc to generate an internal row address strobe signal /RAS in response to an external row address strobe signal Ext./RAS. /CAS buffer 15 operates by external power supply voltage Ext.Vcc to generate an internal column stress strobe signal /CAS in response to an external column stress strobe signal Ext./CAS. /WE buffer 16 operates by external power supply voltage Ext.Vcc to generate an internal write enable signal /WE to activate write driver 23 in response to an external write enable signal Ext./WE. Address buffer 17 operates by external power supply voltage Ext.Vcc to supply an external address signal EAD to row decoder 18 as a row address signal RAD in response to internal row address strobe signal /RAS, and to supply an external address signal EAD to column decoder 20 as a column address signal CAD in response to internal column address strobe signal /CAS. Row decoder 18 selects a row (word line) in memory cell array 13 in response to row address signal RAD from address buffer 17. Word line driver 19 drives a selected word line up to the level of potential Vpp. Column decoder 20 responds to column address signal CAD from address buffer 17 to select a column (bit line pair) in memory cell array 13. Amplifier 21 amplifies and provides to input/output buffer 22 the data signal read out from a memory cell (not shown) in memory cell array 13. Input/output buffer 22 provides the data signal from amplifier 21 to logic circuit 2 and the data signal from logic circuit 2 to write driver 23. Write driver 23 receives internal power supply voltage Vcc2 to operate for writing the data signal from input/output buffer 22 into a memory cell in memory cell array 13. GIO precharge circuit 24 receives internal power supply voltage Vcc2 to operate for precharging a global input/output line pair (not shown). Sense amplifier 25 receives internal power supply voltage Vcc1 to operate for amplifying a data signal read out from a memory cell (not shown) in memory cell array 13.

Figure 2:
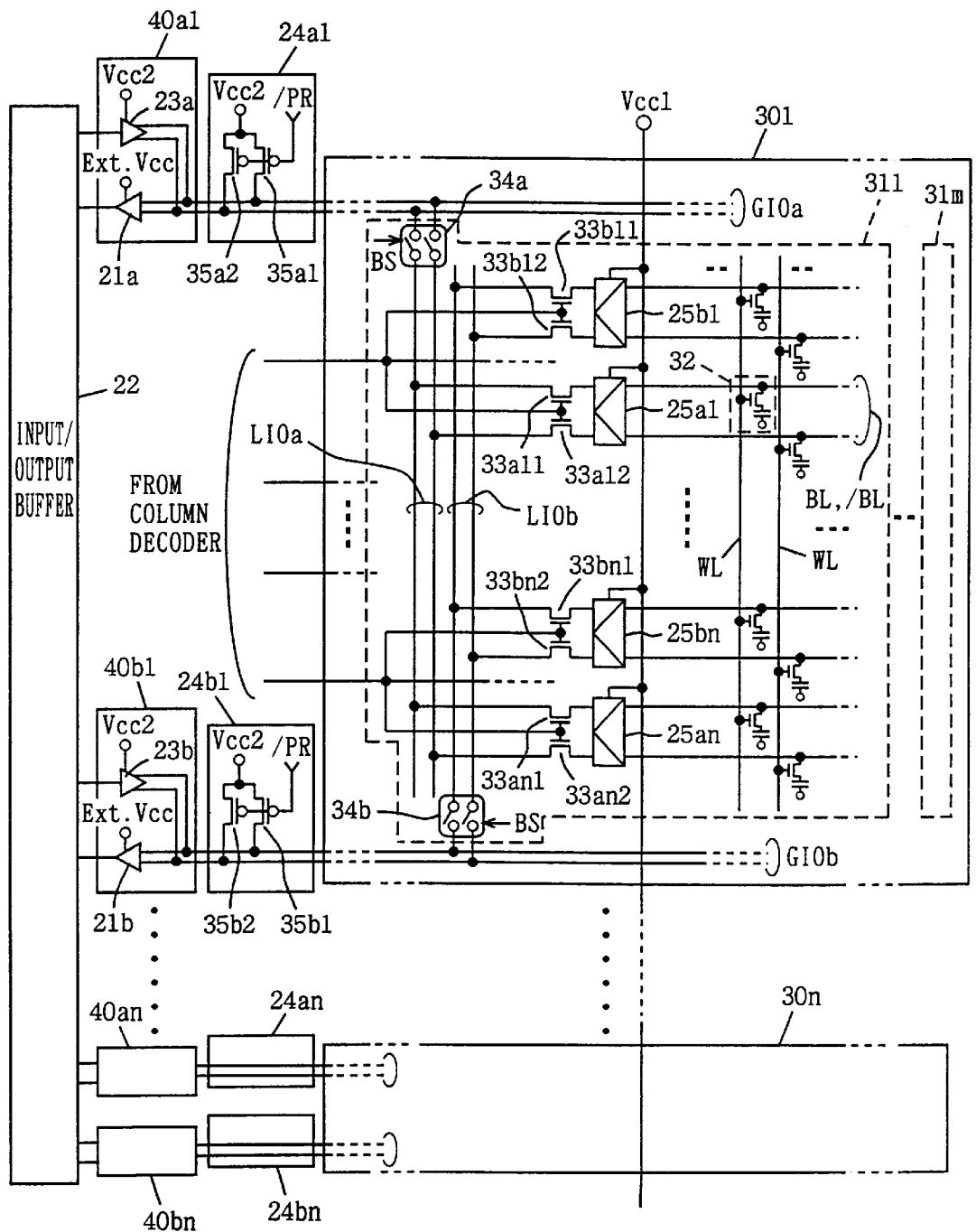
FIG. 2 is a block diagram showing in detail the structure of the memory cell array, the amplifier, the write driver, the GIO line precharge circuit, and the sense amplifier of FIG. 1.

FIG. 2 shows the details of memory cell array 13, amplifier 21, write driver 23, GIO line precharge circuit 24, and sense amplifier 25 of FIG. 1. Referring to FIG. 2, n memory blocks 301–30n, 2n GIO line precharge circuits 24a1–24bn, and 2n input/output blocks 40a1–40bn are provided. Memory block 301 includes two global input/output line pairs GIO and m subblocks 311–31m. One global input/output line pair GIOa is connected to an input/output block 40a1 and a GIO line precharge circuit 24a1, and also tom subblocks 311–31m in memory block 301. The other global input/output line pair GIOb is connected to an input/output block 40b and a GIO line precharge circuit 24b1, and to n subblocks 311–31m in memory block 301. Each of subblocks 311–31m includes a plurality of memory cells 32 arranged in rows and columns, a plurality of word lines WL arranged in rows, a plurality of bit line pairs BL and /BL arranged in columns, a plurality of sense amplifiers 25a1–25bn, a plurality of NMOS transistors 33a11, 33a12–33bn1, 33bn2, two local input/output line pairs LIOa and LIOb, and two transfer gates 34a and 34b. Sense amplifiers 25a1–25bn are provided corresponding to a bit line pair BL and /BL, and operate by internal power supply voltage Vcc1 to amplify a data signal read out from memory cell 32. NMOS transistors 33a11, 33a12–33bn1, 33bn2 form column select gates, and are provided corresponding to sense amplifiers 25a1–25bn, respectively.

As to the labels of a global input/output line pair and a local input/output line pair, reference characters GIOa, GIOb . . . and LIOa, LIOb . . . are used to generically refer to the input/output line pair. Reference characters GIO, /GIO and LIO, /LIO are used to represent one pair of complementary lines, respectively.

Representative of the NMOS transistors forming the column select gates, NMOS transistors 33a11 and 33a12 are connected between sense amplifier 25a1 and local input/output line pair LIOa to be turned on/off by a column select signal from column decoder 20 shown in FIG. 1. Local input/output line pair LIOa is connected to transfer gate 34a and to NMOS transistors 33a11, 33a12–33an1, 33an2. Local input/output line pair LIOb is connected to transfer gate 34b and NMOS transistors 33b11, 33b12–33bn1, 33bn2. Transfer gates 34a and 34b are connected between local input/output line pairs LIOa, LIOb and global input/output line pairs GIOa, GIOb, respectively, to be turned on/off in response to a subblock select signal BS.

Subblocks 312–31n each having a structure similar to that of the above-described subblock 311 are provided in memory block 301.

GIO line precharge circuit 24a1 includes PMOS transistors 35a1 and 35a2. PMOS transistor 35a1 has its source connected to internal power supply voltage Vcc2 and its drain connected to one line of the pair of global input/output lines GIOa to be turned on/off by a global input/output line precharge signal /PR. PMOS transistor 35a2 has its source connected to internal power supply voltage Vcc2 and its drain connected to the other line of the pair of input/output lines GIOa to be turned on/off by global input/output line precharge signal /PR.

A global input/output line precharge circuit 24b1 having a structure similar to that of the above-described global input/output line precharge circuit 24a1 is provided corresponding to global input/output line pair GIOb.

Input/output block 40a1 includes an amplifier 21a and a write driver 23a. Amplifier 21a operates by external power supply voltage Ext.Vcc, and is connected between global input/output line pair GIOa and input/output buffer 22 to amplify a data signal from global input/output line GIOa. Write driver 23a operates by internal power supply voltage Vcc2, and is connected between input/output buffer 22 and global input/output line pair GIOa. Write driver 23a amplifies the data signal from input/output buffer 22 and transfers the amplified signal to global input/output line pair GIOa.

An input/output block 40b1 having a structure similar to that of the above-described input/output block 40a1 is provided corresponding to global input/output line pair GIOb. Also, GIO line precharge circuits 24a2, 24b2–24an, 24bn and input/output blocks 40a2, 40b2–40an, 40bn similar to those of the above-described global input/output line precharge circuits 24a1, 24b1 and input/output blocks 40a1, 40b1, respectively, are provided corresponding to memory blocks 302–30n, respectively.

Figure 3:
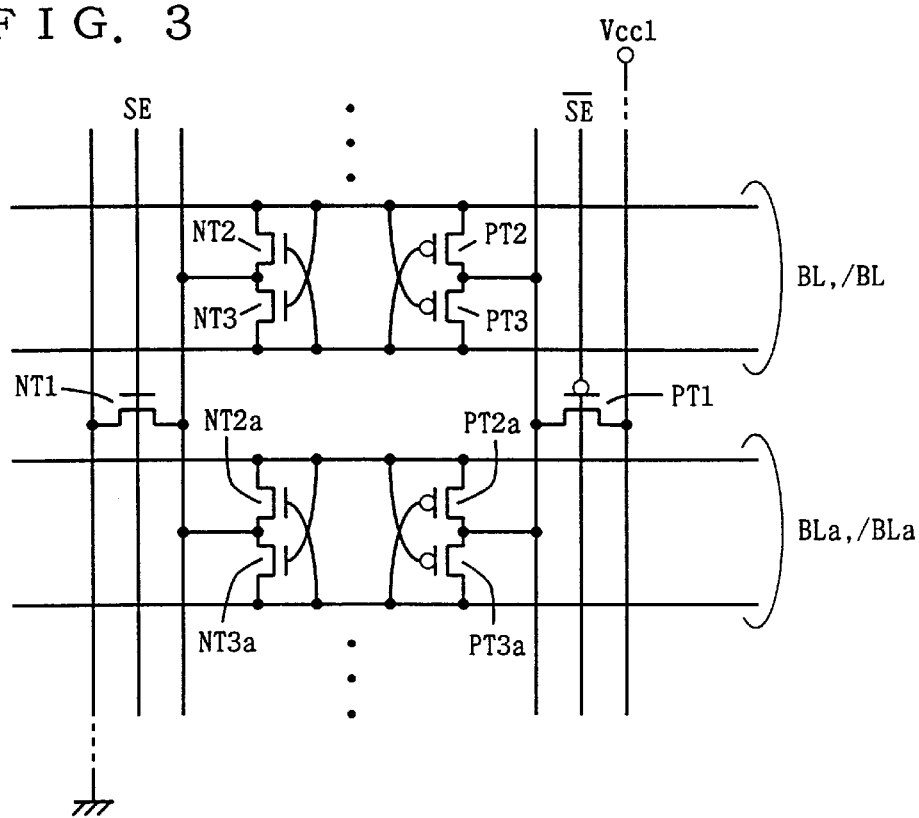
FIG. 3 is a circuit diagram showing a specific structure of the sense amplifier of FIG. 2.

FIG. 3 is a circuit diagram showing a specific structure of sense amplifiers 25a1–25bn of FIG. 2. Referring to FIG. 3, sense amplifiers 25a1–25bn include cross-coupled PMOS transistors PT2 and PT3 for driving the bit line of higher potential out of a corresponding bit line pair BL, /BL to a power supply potential level (Vcc1), cross-coupled NMOS transistors NT2 and NT3 for driving the bit line of the lower potential of the corresponding bit line pair to a ground potential level (GND), a PMOS transistor PT1 rendered conductive in response to a sense amplifier activation signal /SE to activate cross-coupled PMOS transistors PT2 and PT3, and an NMOS transistor NT1 rendered conductive in response to a sense amplifier activation signal SE to activate cross-coupled NMOS transistors NT2 and NT3.

A similar sense amplifier is formed corresponding to a pair of bit lines BLa and /BLa, including PMOS transistors PT2a and PT3a and NMOS transistors NT2a, NT3a.

Figure 4:
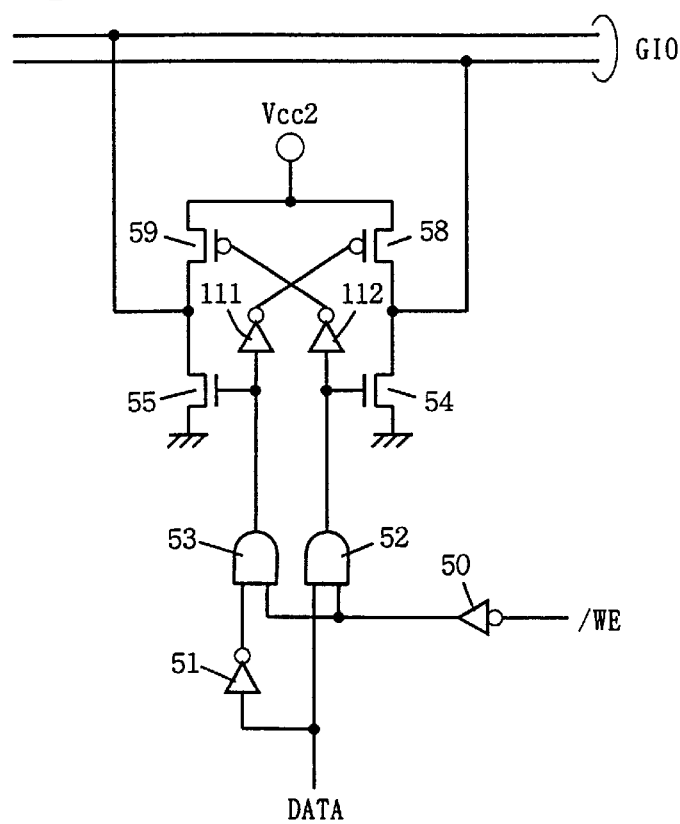
FIG. 4 is a circuit diagram showing a specific structure of the write driver of FIG. 2.

FIG. 4 is a circuit diagram showing a specific structure of write drivers 23a and 23b of FIG. 2. Referring to FIG. 4, write drivers 23a and 23b include inverters 50, 51, 111, and 112, AND gates 52 and 53, NMOS transistors 54 and 55, and PMOS transistors 58 and 59. Inverter 50 inverts write enable signal /WE and outputs an inverted version thereof. Inverter 51 inverts the value of data signal DATA and outputs an inverted version thereof. AND gate 52 receives the signal output from inverter 50 and data signal DATA to output the logical produce thereof. AND gate 53 receives the output signals from inverters 50 and 51 to output a logical product thereof. NMOS transistor 54 has its source connected to ground, and its drain connected to one of global input/output line pairs GIOa, GIOb and to PMOS transistor 58 to be turned on/off by an output signal from AND gate 52. NMOS transistor 55 has its source connected to ground, and its drain connected to the other of global input/output line pairs GIOa, GIOb and to PMOS transistor 59 to be turned on/off by an output signal from AND gate 53. Inverter 111 inverts a signal output from AND gate 53 and provides an inverted version thereof. Inverter 112 inverts a signal output from AND gate 52 and provides an inverted version thereof PMOS transistor 58 has its source connected to internal power supply voltage Vcc2 and its drain connected to one of global input/output line pairs GIOa, GIOb to which NMOS transistor 54 is connected and to NMOS transistor 54 to be turned on/off by an output signal from inverter 111. PMOS transistor 59 has its source connected to internal power supply voltage Vcc2 and its drain connected to one of global input/output line pairs GIOa, GIOb to which NMOS transistor 55 is connected and to NMOS transistor 55 to be turned on/off by an output signal from inverter 112.

The operation of write drivers 23a and 23b of the above structure will be described hereinafter. When write enable signal /WE is at an H level (logical high), AND gates 52 and 53 provide an output signal of an L level (logical low) since a signal of an L level is applied to one input terminal of AND gates 52 and 53. Therefore, NMOS transistors 54, 55 and PMOS transistors 58, 59 are turned off.

When write enable signal /WE is at an L level and data signal DATA from input/output buffer 22 is at an H level, the output of AND gate 52 attains an H level. Therefore, NMOS transistor 54 and PMOS transistor 59 are turned on. In contrast, the output from AND circuit 53 attains an L level, whereby NMOS transistor 55 and PMOS transistor 58 are turned off.

As a result, the global input/output line that is connected to NMOS transistor 54 and PMOS transistor 58 attains the ground potential, whereas the global input/output line connected to NMOS transistor 55 and PMOS transistor 59 attains the potential of Vcc2.

When write enable signal /WE is at an L level and data signal DATA from input/output buffer 22 is at an L level, the output of AND circuit 53 attains an H level. Therefore, NMOS transistor 55 and PMOS transistor 58 are turned on. In contrast, the output from AND circuit 52 attains an L level, whereby NMOS transistor 54 and PMOS transistor 59 are turned off.

As a result, the global input/output line that is connected to NMOS transistor 55 and PMOS transistor 59 attains the ground potential, whereas the global input/output line connected to NMOS transistor 54 and PMOS transistor 58 attains the level of Vcc2.

Figure 5:
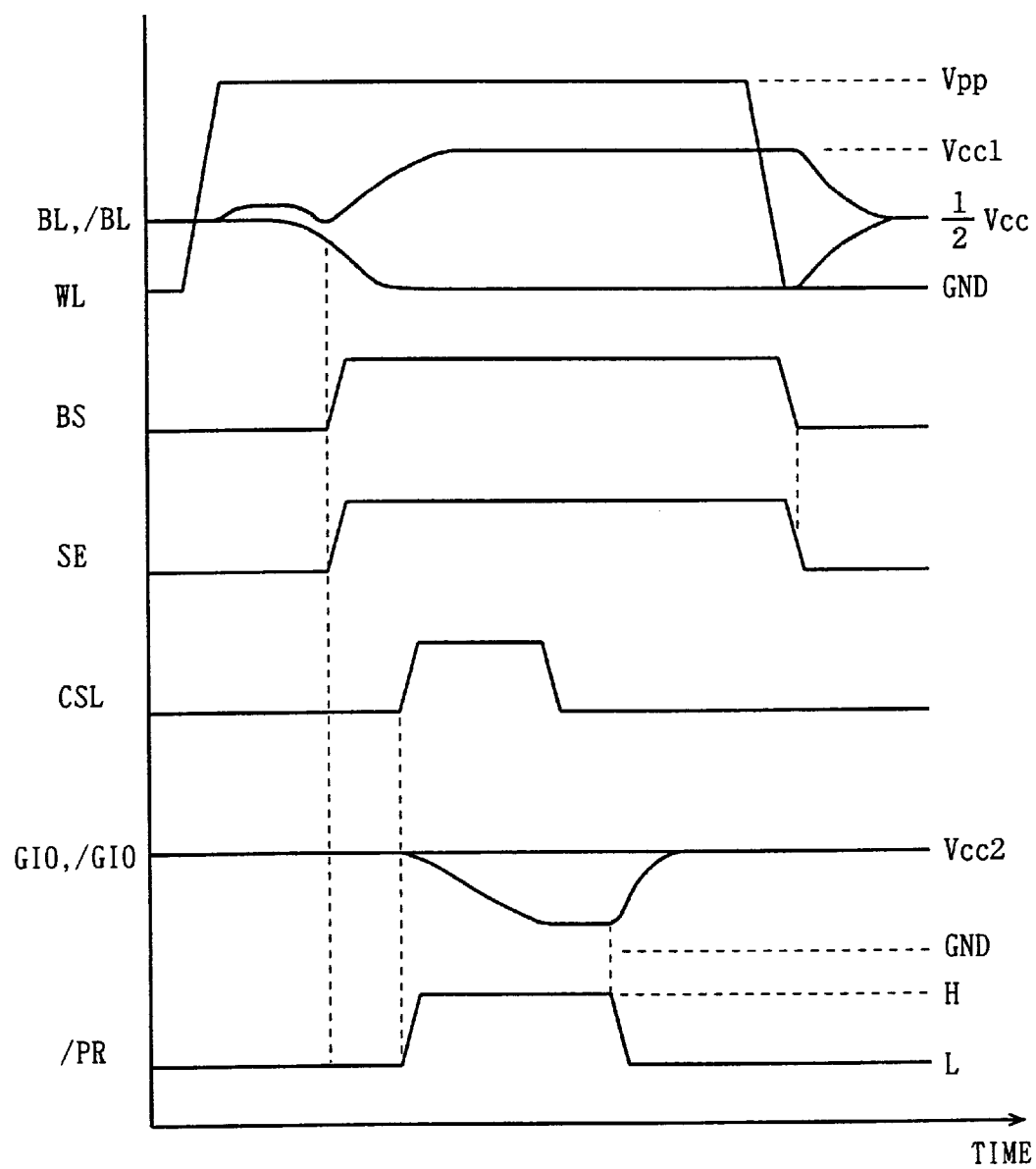
FIG. 5 is a timing chart for describing an operation of the system LSI according to the first embodiment of the present invention.

The operation of the above system LSI will be described hereinafter with reference to FIG. 5.

In a standby state where data is not written/read into/out memory cell 32 in DRAM1, global input/output line precharge signal /PR attains an L level. Therefore, PMOS transistors 35a1 and 35a2 of global input/output line precharge circuit 24a1 are turned on. As a result, global input/output line pair GIOa is precharged to the level of Vcc2. An operation of reading out data from a memory cell will be described hereinafter.

When a word line WL corresponding to the row including the accessed memory cell (for example, memory cell 32) is boosted to potential Vpp, potential difference is generated between the pair of bit lines BL and /BL corresponding to memory cell 32 according to the charge stored in memory cell 32.

Then, sense amplifier activation signal SE and subblock select signal BS rise to an H level. Accordingly, the potential difference between bit lines BL and /BL is amplified by sense amplifier 25a1 to the potential difference of Vcc. Also, transfer gate 34a is rendered conductive, and connection is established between global input/output line pair GIOa and local input/output line pair LIOa.

Then, global input/output line precharge signal /PR is pulled up to an H level. In response, PMOS transistors 35a1 and 35a2 are turned off. As a result, global input/output line precharge circuit 24a1 and global input/output line pair GIOa are disconnected.

Simultaneous to the rise of global input/output line precharge signal /PR to an H level, column select signal CSL applied to the gates of NMOS transistors 33a11 and 33a12 from column decoder 18 is pulled up to an H level, whereby NMOS transistors 33a11 and 33a12 are turned on. As a result, the potential difference Vcc1 between the pair of bit lines BL and /BL amplified by sense amplifier 25a1 is transferred to local input/output line pair LIOa, and further to global input/output line pair GIOa. This potential difference Vcc1 is amplified by amplifier 21a to be sent to input/output buffer 22.

The operation of writing data into a memory cell (for example, memory cell 32) will be described hereinafter.

Data signal DATA is transferred from input/output buffer 22 to write driver 23a. Write enable signal /WE is pulled down, and data signal DATA is received by write driver 23a. One of the two outputs of write driver 23a attains a Vcc2 level and the other a ground level according to the level of data signal DATA. Global input/output line precharge signal /PR, subblock select signal BS, and column select signal CSL attain an H level. In response, global input/output line pair GIOa and local input/output line pair LIOa are connected, whereby NMOS transistors 33a11 and 33a12 are turned on. As a result, the data signal from write driver 23a is transferred up to sense amplifier 25a1. Sense amplifier activation signal SE is driven to an H level, whereby data is written into memory cell 32.

The above-described read/write operations are similarly carried out for global input/output line pair GIOb, local input/output line pair LIOb, and input/output block 40b1, global input/output line precharge circuit 24b1, transfer gate 34b, NMOS transistor 33b11–33bn2, and sense amplifiers 25b1–25bn connected thereto.

Furthermore, an operation similar to that described above is carried out for memory blocks 302–30n.

Thus, each of memory blocks 301–30n can be accessed simultaneously from input/output buffer 22 through global input/output line pairs GIOa and GIOb provided in each of memory blocks 301–30n. The number of write drivers 23a, 23b and global input/output line precharge circuits 24a1, 24b1–24an, 24bn increases according to a greater number of memory blocks 301–30n. Therefore, the amount of current supplied during operation of write drivers 23a1, 23b1 and global input/output line precharge circuits 24a1–24bn increases.

Figure 6:
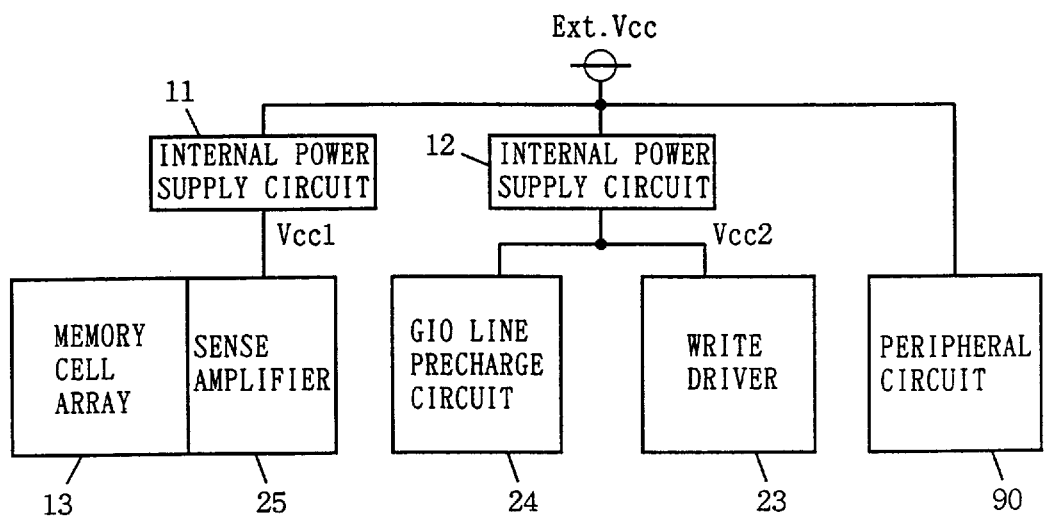
FIG. 6 is a block diagram showing a power supply system of the DRAM of the first embodiment.

FIG. 6 is a block diagram showing the power supply system of DRAM 1 of the first embodiment. In DRAM 1 of FIG. 6, an internal power supply circuit 11 for driving sense amplifier 25 and an internal power supply circuit 12 for global input/output line precharge circuit 24 and write driver 23 are provided to isolate internal power supply Vcc1 supplied to sense amplifier 25 from internal power supply Vcc2 supplied to global input/output line precharge circuit 24 and write driver 23. Peripheral circuit 90 including an address buffer 17, a /RAS buffer 14, a /CAS buffer 15, a /WE buffer 16 and the like are driven by external power supply voltage Ext.Vcc.

In the case where noise is generated in the power supply line caused by the power supply current applied to global input/output line precharge circuit 24 in charging/ discharging global input/output line pairs GIOa and GIOb and by the power supply current applied to write driver 23 during the operation of write driver 23, the noise will not be propagated to the power supply lines towards sense amplifier 25 and peripheral circuit 90.

Figure 7:
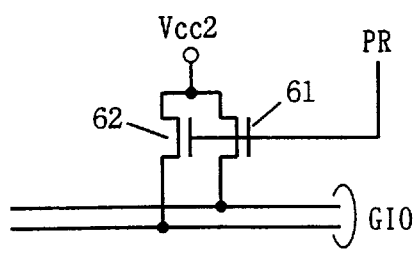
FIG. 7 is a circuit diagram showing another structure of the global input/output line precharge circuit of FIG.2.

Although PMOS transistor 35 is used in global input/ output line precharge circuit 24, NMOS transistors 61 and 62 shown in FIG. 7 can also be used.

Second Embodiment

Figure 8:
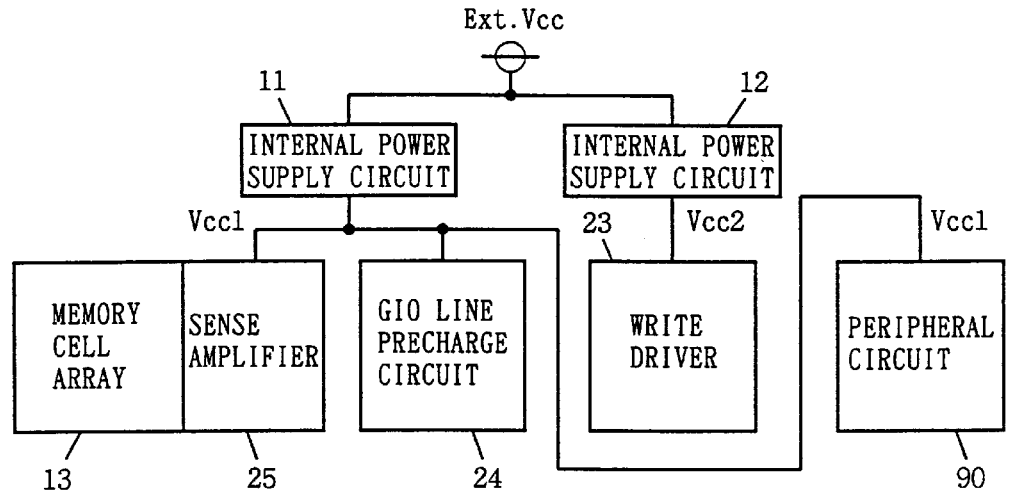
FIGS. 8–15 are block diagrams of the power supply system in a DRAM of the system LSI according to second to ninth embodiments, respectively, of the present invention.

FIG. 8 is a block diagram showing the power supply system in a DRAM of a system LSI according to a second embodiment of the present invention. According to the second embodiment of FIG. 8, an internal power supply circuit 11 for applying power supply Vcc1 to drive sense amplifier 25, global input/output line precharge circuit 24, and peripheral circuit 90, and an internal power supply circuit 12 for applying power supply Vcc2 to drive write driver 23 are provided.

Therefore, even if noise is generated in the power supply line towards to the write driver caused by the power supply current to the write driver during operation thereof, the noise will not be propagated to the power supply line towards sense amplifier 25.

Third Embodiment

Figure 9:
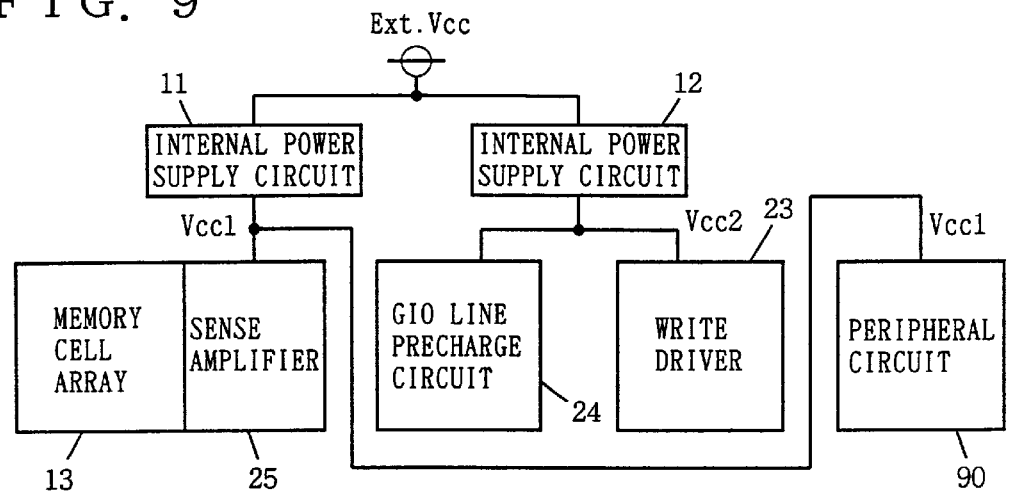

FIG. 9 is a block diagram showing a power supply system in a DRAM of a system LSI according to a third embodiment of the present invention. According to the third embodiment of FIG. 9, an internal power supply circuit 11 for supplying power supply Vcc1 to drive sense amplifier 25 and peripheral circuit 90, and an internal power supply circuit 12 for supplying power supply Vcc2 to drive write driver 23 and global input/output line precharge circuit 24 are provided.

Even when noise is generated in the power supply line towards write driver 23 and global input/output line precharge circuit 24 caused by the power supply current to write driver 23 during operation of write driver 23 and by the current consumed in charging/discharging global input/ output line pairs GIOa, GIOb by global input/output line precharge circuit 24, the noise will not be propagated to the power supply line towards sense amplifier 25 and peripheral circuit 90.

Fourth Embodiment

Figure 10:
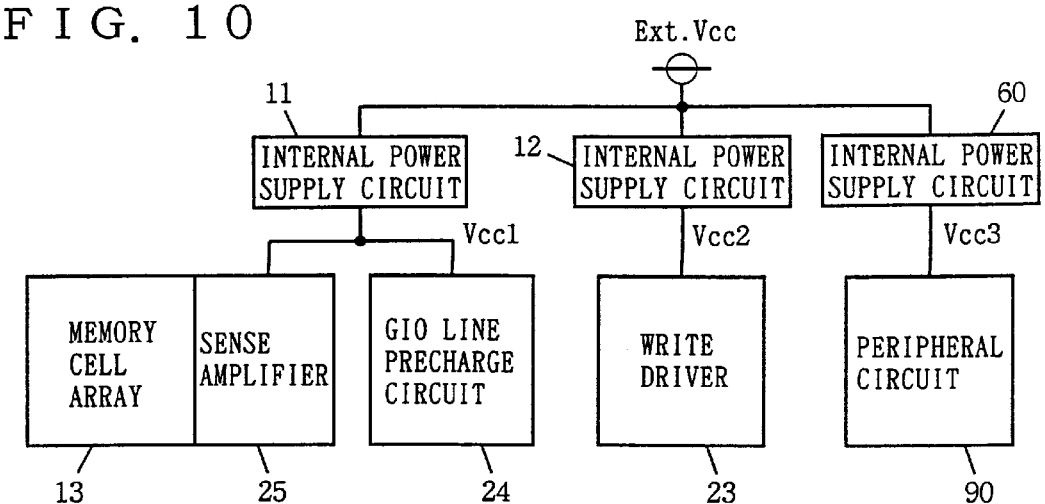

FIG. 10 is a block diagram showing a power supply system in a DRAM in a system LSI according to a fourth embodiment of the present invention.

According to the fourth embodiment of FIG. 10, an internal power supply circuit 11 for supplying power supply Vcc1 to drive sense amplifier 25 and global input/output line precharge circuit 24, an internal power supply circuit 12 for supplying power supply Vcc2 to drive write driver 23, and an internal power supply circuit 60 for supplying a power supply Vcc3 to drive peripheral circuit 90 are provided.

Even in the case where noise is generated in the power supply line to write driver 23 caused by the power supply current to write driver 23 during operation thereof, the noise will not be propagated to the power supply lines towards sense amplifier 25 and peripheral circuit 90.

Also, the provision of an individual internal power supply circuit 60 for peripheral circuit 90 allows internal power supply voltage Vcc3 to be set to values different from those of Vcc1 and Vcc2 in order to improve the operating speed of the peripheral circuit.

Fifth Embodiment

Figure 11:
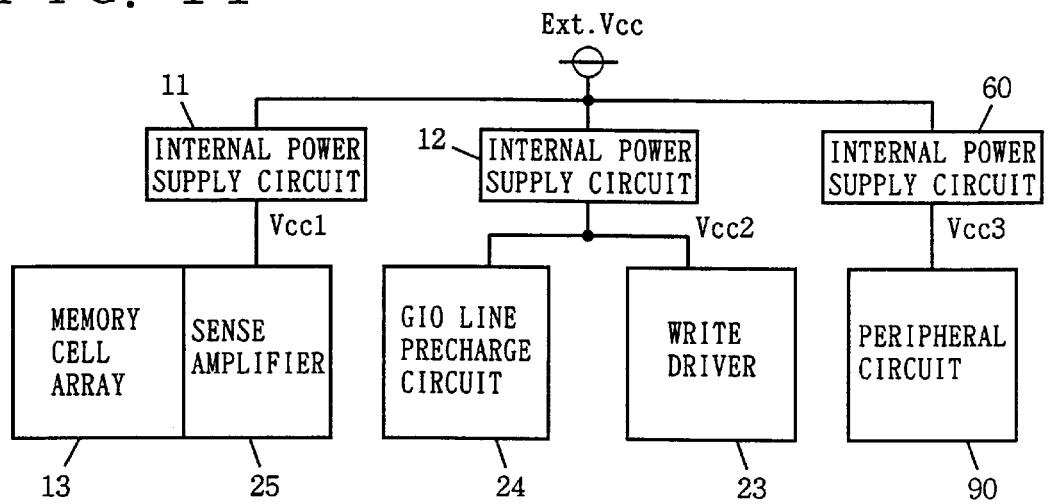

FIG. 11 is a block diagram showing the power supply system in a DRAM of a system LSI according to a fifth embodiment of the present invention. According to the fifth embodiment of FIG. 11, an internal power supply circuit 11 for supplying power supply Vcc1 to drive sense amplifier 25, an internal power supply circuit 12 for supplying power supply Vcc2 to drive write driver 23 and global input/output line precharge circuit 24, and an internal power supply circuit 60 to provide power supply Vcc3 to drive peripheral circuit 90 are provided.

Even when noise is generated in the power supply line to write driver 23 and global input/output line precharge circuit 24 caused by the power supply current to write driver 23 during operation of write driver 23 and by the current consumed in charging/discharging global input/output line pairs GIOa and GIOb by global input/output line precharge circuit 24, the noise will not be propagated to the power supply line towards sense amplifier 25 and peripheral circuit 90.

Sixth Embodiment

In the previous first to fifth embodiments, internal power supply circuits are provided within the DRAM to drive sense amplifier 25, write driver 23, global input/output line precharge circuit 24, and peripheral circuit 90 by an internal power supply voltage generated therefrom. In the present sixth embodiment and subsequent seventh to ninth embodiments, a pad is provided to which external power is applied to drive sense amplifier 25, write driver 23, global input/output line precharge circuit 24, and peripheral circuit 90.

Figure 12:
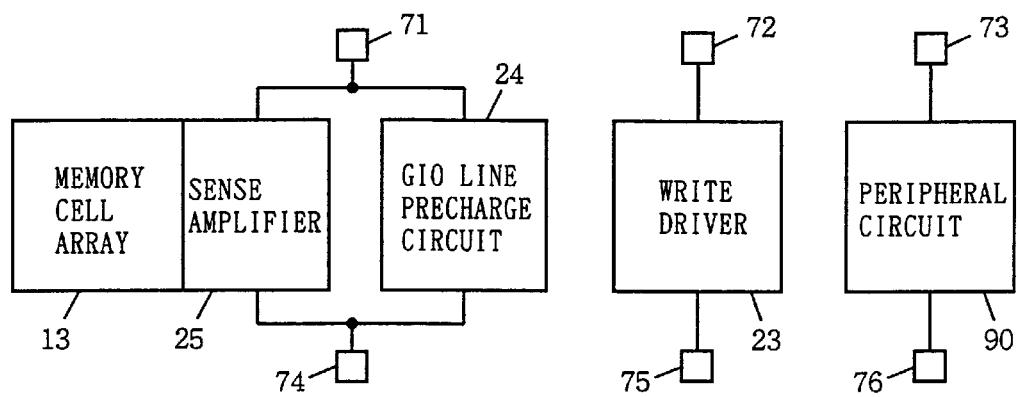

FIG. 12 is a block diagram showing the power supply system in DRAM according to the sixth embodiment of the present invention. Referring to FIG. 12, the DRAM includes pads 71 and 74 connected to sense amplifier 25 and to global input/output line precharge circuit 24, pads 72 and 75 connected to write driver 23, and pads 73 and 76 connected to peripheral circuit 90. Externally applied power supply voltage Vcc is supplied to pads 71, 72, and 73, whereby sense amplifier 25, global input/output line precharge circuit 24, write driver 23, and peripheral circuit 90 are driven by this voltage. Pads 74, 75 and 76 are connected to ground.

Accordingly, the power supply line to drive sense amplifier 25 and global input/output line precharge circuit 24 and the power supply line to drive peripheral circuit 90 are provided as separate systems within the DRAM. Even when noise is generated in the power supply line to write driver 23 caused by the power supply voltage applied to write driver 23 during operation thereof, the noise will not be propagated to the power supply line towards sense amplifier 25 and peripheral circuit 90.

Seventh Embodiment

Figure 13:
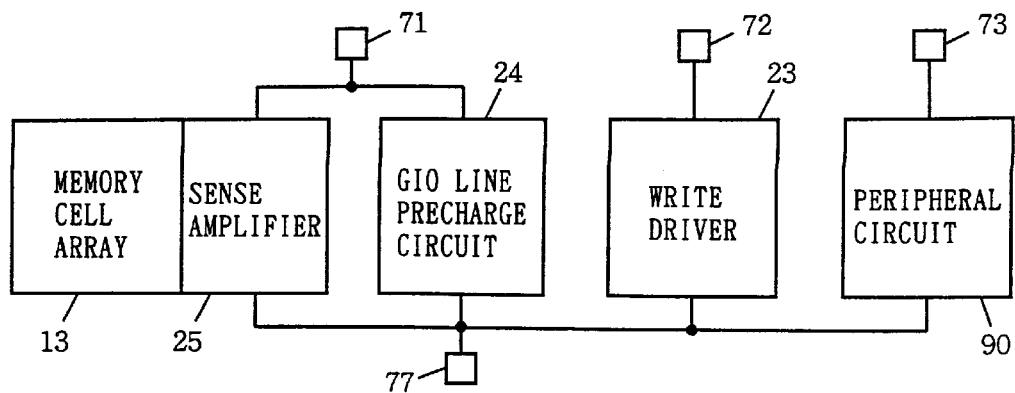

FIG. 13 is a block diagram showing a power supply system within a DRAM according to a seventh embodiment of the present invention. The DRAM of FIG. 13 has pads 74, 75 and 76 of FIG. 12 united into one pad 77.

Since pads 74, 75 and 76 are connected to ground, an advantage similar to that of the sixth embodiment can be achieved even in the present case where a combined one pad is connected to ground. Therefore, the number of pads can be reduced.

Eighth Embodiment

Figure 14:
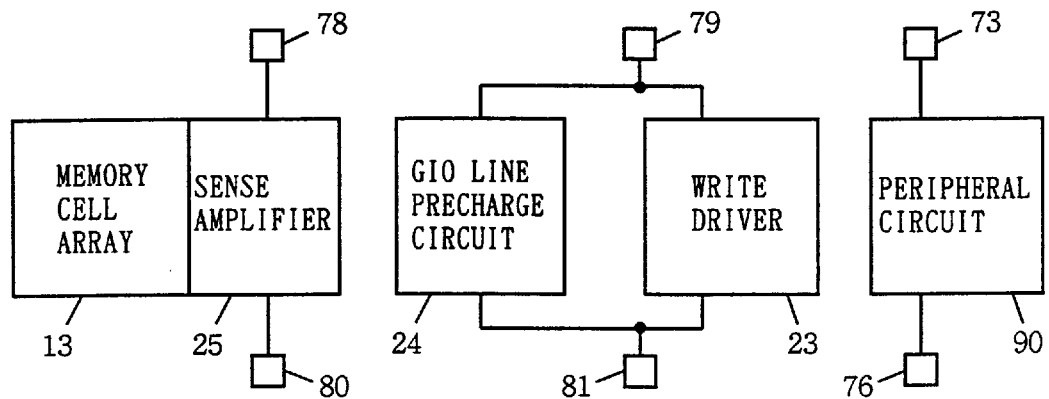

FIG. 14 is a block diagram showing the power supply system within a DRAM according to an eighth embodiment of the present invention. Referring to FIG. 14, the DRAM includes pads 78 and 80 connected to sense amplifier 25, pads 79 and 81 connected to write driver 23 and to global input/output line precharge circuit 24, and pads 73 and 76 connected to peripheral circuit 90.

External power supply voltage Vcc is applied to pads 78, 79 and 73. Sense amplifier 25, global input/output line precharge circuit 24, write driver 23 and peripheral circuit 90 are diven by this voltage. Pads 80, 81, and 76 are connected to ground.

Therefore, the power supply line to drive sense amplifier 25, the power supply line to drive write driver 23 and global input/output line precharge circuit 24, and the power supply line to drive peripheral circuit 90 are provided as individual systems within the DRAM. Therefore, even when noise is generated in the power supply line towards write driver 23 and global input/output line precharge circuit 24 caused by the power supply voltage applied to write driver 23 during operation thereof and by the current consumed in charging/discharging global input/output line pairs GIOa and GIOb by global input/output line precharge circuit 24, the noise will not be propagated to the power supply line towards sense amplifier 25 and peripheral circuit 90.

Ninth Embodiment

Figure 15:
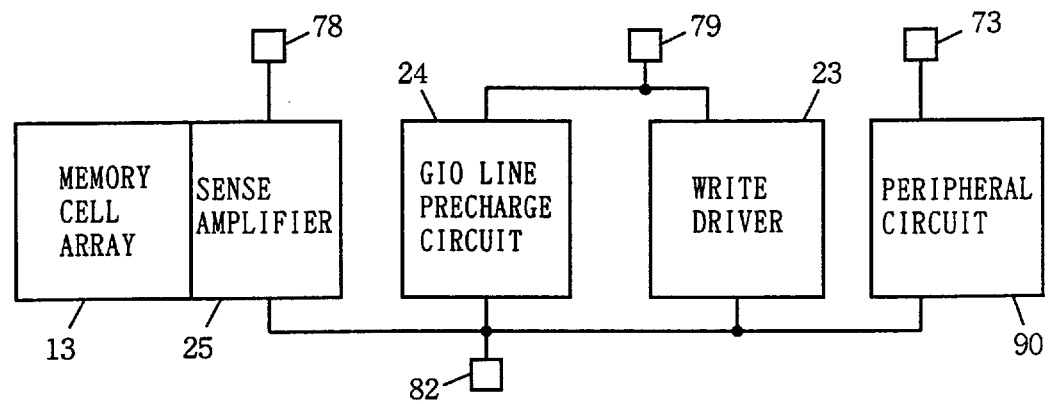

FIG. 15 is a block diagram showing a power supply system within a DRAM according to a ninth embodiment of the present invention. The DRAM of FIG. 15 has pads 80, 81 and 76 of FIG. 14 consolidated into one pad 82.

Since pads 80, 81 and 76 are connected to ground, an advantage similar to that of the sixth embodiment can be obtained even in the present case where a consolidated pad 82 is connected to ground. There is also the advantage that the number of pads can be reduced.

Tenth Embodiment

Figure 16:
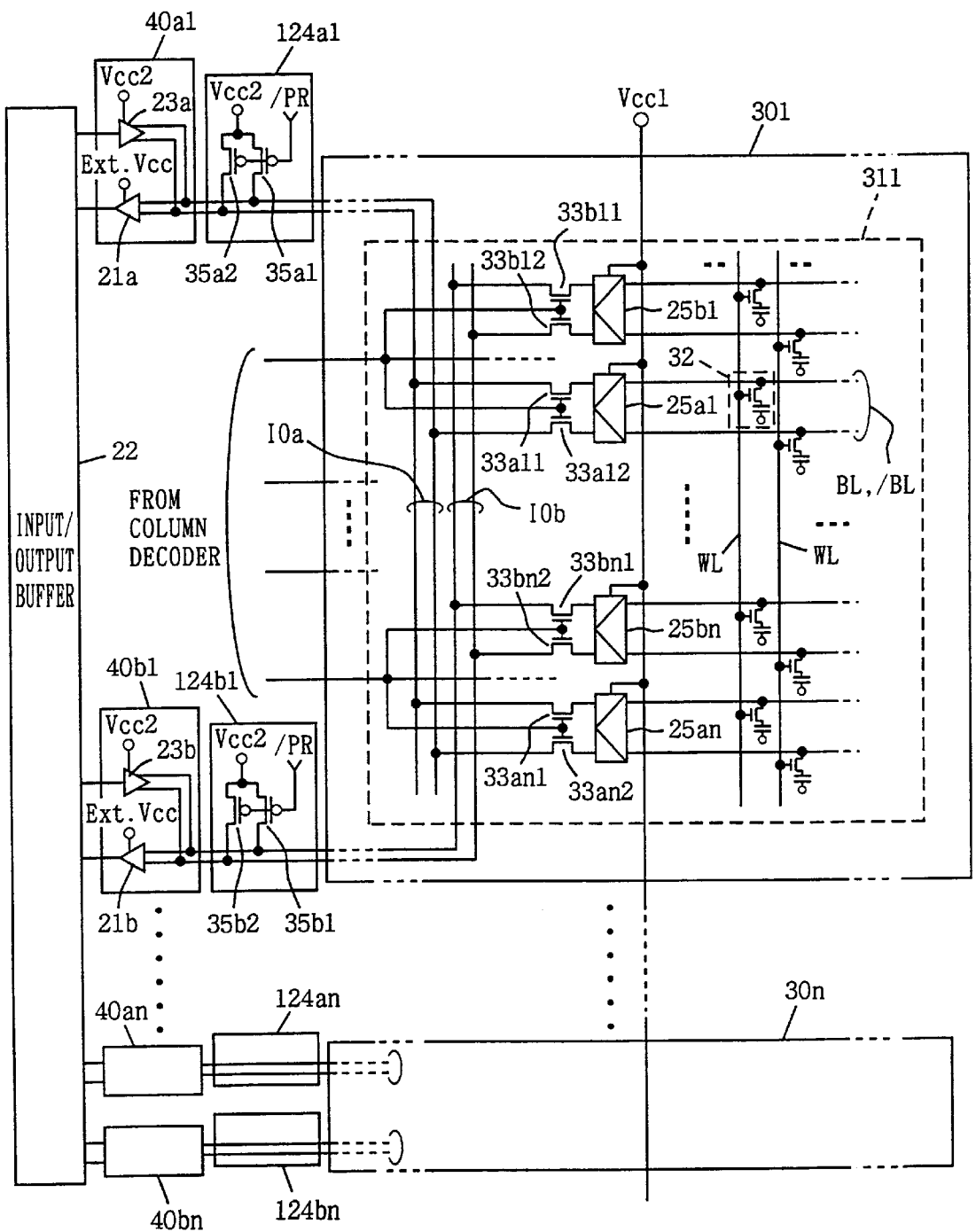
FIG. 16 is a block diagram showing the structure of a memory cell array, an amplifier, a write driver, an I/O line precharge circuit, and a sense amplifier in a system LSI according to a tenth embodiment of the present invention.

FIG. 16 is a block diagram showing the structure of a memory cell array 13, an amplifier 21, a write driver 23, an I/O line precharge circuit 124, and a sense amplifier 25 in a system LSI according to a tenth embodiment of the present invention. In the present tenth embodiment, input/output line pairs IOa and IOb are provided instead of global input/output line pairs GIOa and GIOb and local input/output line pairs LIOa and LIOb of the previous first to ninth embodiments.

Memory block 301 includes input/output line pairs IOa and IOb, and a subblock 311. Input/output line pair IOa is connected to input/output block 40a1 and IO line precharge circuit 124a1, and to NMOS transistors 33a11, 33a12–33an1, 33an2 in memory block 301. Input/output line pair IOb is connected to input/output block 40b1 and IO line precharge circuit 124b1, and to NMOS transistors 33b11, 33b12–33bn1, 33bn2 in memory block 301.

IO line precharge circuit 124a1 includes PMOS transistors 35a1 and 35a2, which are turned on/off in response to an input/output line precharge signal /PR.

IO line precharge circuit 124b1 includes PMOS transistors 35b1 and 35b2, which are turned on/off in response to input/output line precharge signal /PR.

IO line precharge circuits 124a2, 124b2–124an, 124bn similar to the above-described input/output line precharge circuits 124a1 and 124b1 are provided corresponding to memory blocks 302–30n, respectively.

An operation of the above system LSI will be described hereinafter.

In a standby state where data is not written/read into/from memory cell 32 of DRAM 1, input/output line precharge signal /PR is at an L level, and PMOS transistors 35a1 and 35a2 of input/output line precharge circuit 124a1 are on. As a result, input/output line pair IOa is precharged to the level of Vcc2. An operation of reading out data from a memory cell will be described hereinafter.

When input/output line precharge signal /PR is pulled up to an H level, PMOS transistors 35a1 and 35a2 are turned off. As a result, input/output line precharge circuit 124a1 and input/output line pair IOa are disconnected.

The potential difference Vcc1 between the pair of bit lines BL and /BL amplified by sense amplifier 25a1 is transferred to input/output line pair IOa, and amplified by amplifier 21a to be provided to input/output buffer 22.

An operation of writing data into a memory cell will be described hereinafter.

When input/output line precharge signal /PR is pulled up to an H level, the data signal from write driver 23a is transferred to sense amplifier 25a1 through input/output line pair IOa, whereby data is written into memory cell 32.

A read/write operation similar to that described above is carried out for input/output line pair IOb and input/output block 40b1, input/output line precharge circuit 124b1, NMOS transistors 33b11–33bn2, and sense amplifiers 25b1–25bn connected thereto.

Also, a similar operation is carried out for memory blocks 302–30n.

Thus, each of memory blocks 301–30n can be accessed simultaneously from input/output buffer 22 through input/output line pair IO connected to each of memory blocks 301–30n. The number of write drivers 23a, 23b and input/output line precharge circuits 124a1, 124b1–124an, 124bn increases as the number of memory blocks 301–30n increases. Therefore, a greater amount of current is supplied when write drivers 23a1, 23b1 and input/output line precharge circuits 124a1–124bn operate.

Figure 17:
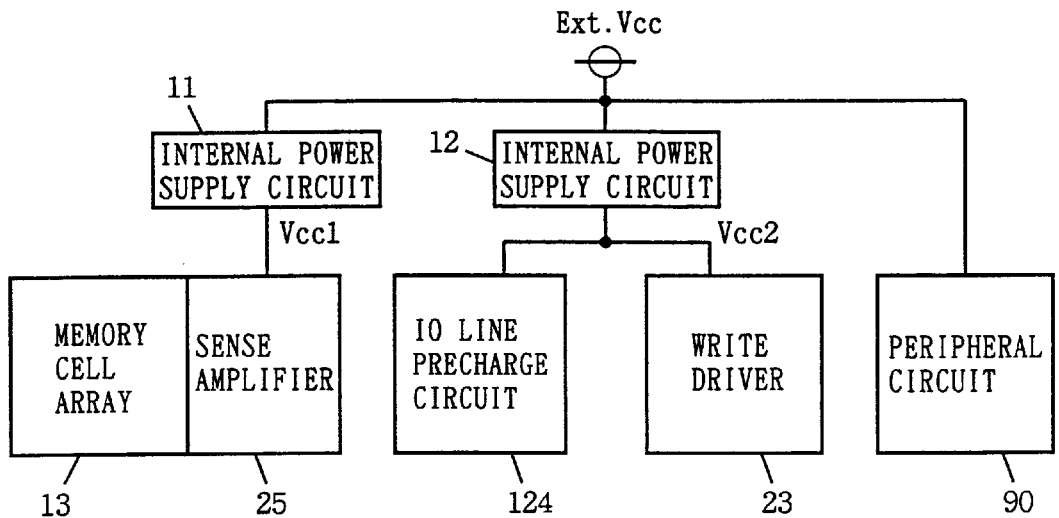
FIGS. 17 and 18 are block diagrams showing a power supply system in the DRAM of a system LSI according to tenth and eleventh embodiments, respectively, of the present invention.

FIG. 17 is a block diagram showing a power supply system of a DRAM 1 according to a tenth embodiment of the present invention. In DRAM 1 of FIG. 17, an internal power supply circuit 11 for driving sense amplifier 25 and an internal power supply circuit 12 for driving input/output line precharge circuit 124 and write driver 23 are provided. An internal power supply Vcc1 supplied to sense amplifier 25 is isolated from an internal power supply Vcc2 applied to input/output line precharge circuit 124 and write driver 23. Peripheral circuit 90 including address buffer 17, /RAS buffer 14, /CAS buffer 15, /WE buffer 16 and the like is driven by external power supply voltage Ext.Vcc.

Therefore, even when noise is generated in the power supply line caused by the power supply current applied to input/output line precharge circuit 124 in charging/ discharging input/output line 10 and by the power supply current applied to write driver 23 during operation thereof, the noise will not be propagated to the power supply line towards sense amplifier 25 and peripheral circuit 90.

By substituting GIO line precharge circuit 24 of FIGS. 8–11 with IO line precharge circuit 124, the power supply system of DRAM 1 can be implemented similar to that of the second to fifth embodiments to obtain similar effects.

Eleventh Embodiment

Figure 18:
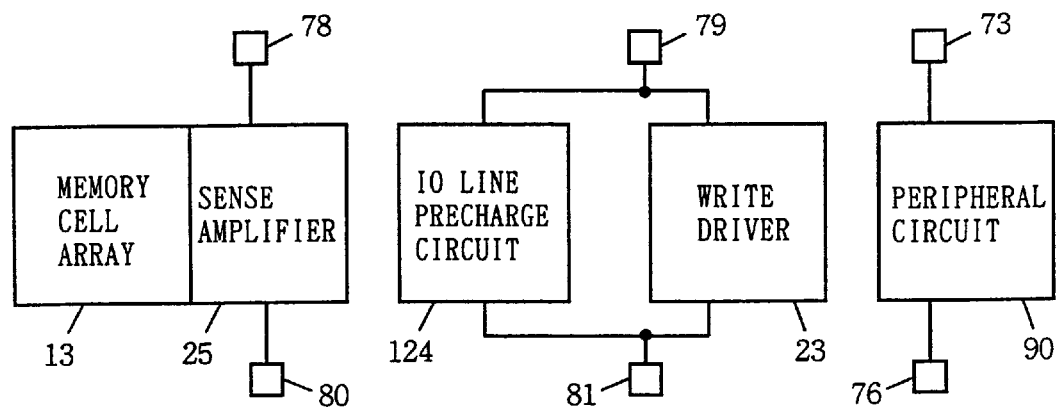

FIG. 18 is a block diagram showing a power supply system in a DRAM according to an eleventh embodiment of the present invention. In FIG. 18, GIO line precharge circuit 24 of FIG. 14 is replaced with an IO line precharge circuit 124.

Therefore, the power supply line for driving sense amplifier 25 and the power supply line for driving write driver 23 and input/output line precharge circuit 124, and the power supply line for driving peripheral circuit 90 are provided as individual systems within the DRAM. Therefore, even when noise is generated in the power supply line towards write driver 23 and input/output line precharge circuit 124 caused by the power supply voltage applied to write driver 23 during operation thereof and by the current consumed in charging/discharging the input/output line pair by input/ output line precharge circuit 124, the noise will not be propagated to the power supply line towards sense amplifier 25 and peripheral circuit 90.

By substituting GIO line precharge circuit 24 of FIGS. 12, 13 and 15 with IO line precharge circuit 124, the power supply system of DRAM 1 can be implemented similar to that of the previous sixth, seventh, and ninth embodiments to obtain a similar effect.

Twelfth Embodiment

FIG. 19 is a block diagram showing an entire structure of a system LSI according to a twelfth embodiment of the present invention. Referring to FIG. 19, the system LSI includes a synchronous DRAM 1 and a logic circuit 2. Synchronous DRAM 1 and logic circuit 2 are provided on the same chip CH. Input and output data DQ are transferred therebetween.

Synchronous DRAM 1 includes a control signal buffer 132 instead of /RAS buffer 14, /CAS buffer 15, and /WE buffer 16 shown in FIG. 1, and also a clock buffer 131. Clock buffer 131 receives external power supply voltage Ext.Vcc to operate for generating an internal clock signal int.CLK in response to a clock signal CLK from logic circuit 2. Control signal buffer 132 receives external power supply voltage Ext.Vcc to operate to generate an internal control signal int.CTL in synchronization with internal clock signal int.CLK according to a control signal CTL from logic circuit 2. Address buffer 17 receives external power supply voltage Ext.Vcc to operate for supplying an external address signal EAD to row decoder 18 as a row address signal RAD or to column decoder 20 as column address signal CAD in response to internal control signal int.CTL. Write driver 23 receives internal power supply voltage Vcc2 to operate for writing the data signal from input/output buffer 22 into a memory cell in response to internal control signal int.CTL.

The operation of the system LSI of the above structure will be described hereinafter.

Internal control signal int.CTL for strobing a row address is generated in control signal buffer 132 in synchronization with the clock of internal clock signal int.CLK from clock buffer 131. A row address is received in response to internal control signal int.CTL, whereby a corresponding word line is selected. In synchronization with the clock of the next internal clock signal int.CLK, internal clock signal int.CTL for strobing a column address is generated in control signal buffer 132. In response to this internal control signal int.CTL, a column address is received, whereby the data in the memory cell is read out onto the input/output line by column decoder 20. This data is output in synchronization with internal clock signal int.CLK.

In the present DRAM 1, internal power supply circuit 11 for driving sense amplifier 25 and internal power supply circuit 12 for driving global input/output line precharge circuit 24 and write driver 23 are provided so that internal power supply Vcc1 supplied to sense amplifier 25 is disconnected from internal power supply Vcc2 applied to global input/output line precharge circuit 24 and write driver 23. The peripheral circuit including address buffer 17, clock buffer 131, control signal buffer 132 and the like is driven by external power supply voltage Ext.Vcc.

Therefore, even when noise is generated in the power supply line caused by the power supply current applied to global input/output line precharge circuit 24 in charging/ discharging global input/output line pairs GIOa and GIOb and by the power supply current applied to write driver 23 during operation thereof, the noise is not propagated to the power supply line towards sense amplifier 25 and the peripheral circuit.

Thirteenth Embodiment

The previous first to twelfth embodiments are directed to prevent the adverse affect of noise corresponding to increased current consumption in a write driver and a global input/output line precharge circuit in accordance with increase of the internal bus width from influencing other circuits such as the sense amplifier and peripheral circuits.

In the thirteenth embodiment, solution of the problem required to reduce the memory cell array power supply, i.e., the voltage level of the sense amplifier power supply, is considered.

Figure 20:
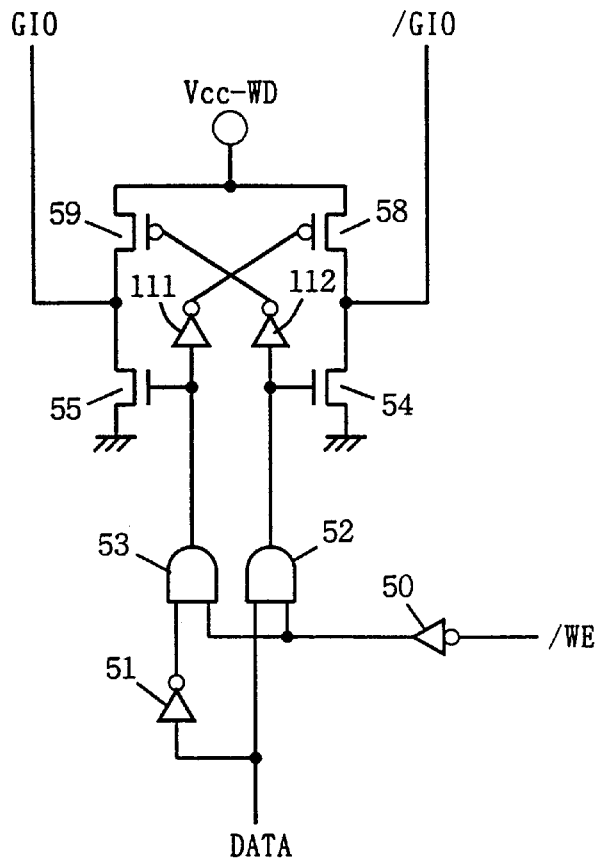
FIG. 20 shows a structure of a write driver 23 in a DRAM according to a thirteenth embodiment of the present invention.

FIG. 20 shows a structure of write driver 23. In the thirteenth embodiment, the level of the power supply voltage to write driver 23 is set identical to the voltage of the sense amplifier power supply.

More specifically, the voltage level of the drive power supply Vcc-WD of the write driver in FIG. 20 is set identical to the level of supply voltage Vcc1 of the power supply for the internal power supply circuit in the first to twelfth embodiments. Accordingly, the amplitude level of global input/output line pair GIO, /GIO can be reduced to allow high speed operation by virtue of reduction in the equalize operation time and reduction in current consumption.

These advantages are particularly significant in an embedded DRAM with a wide internal bus width transferring a large amount of data at one time.

By setting the voltage level of the drive power supply of write driver 23 identical to the voltage level of the sense amplifier power supply, a hierarchical I/O line structure can be employed even when the voltage level of the sense amplifier power source is set lower than the voltage of the drive power supply of the peripheral circuit. The reason thereof will be described in detail hereinafter.

Figure 21:
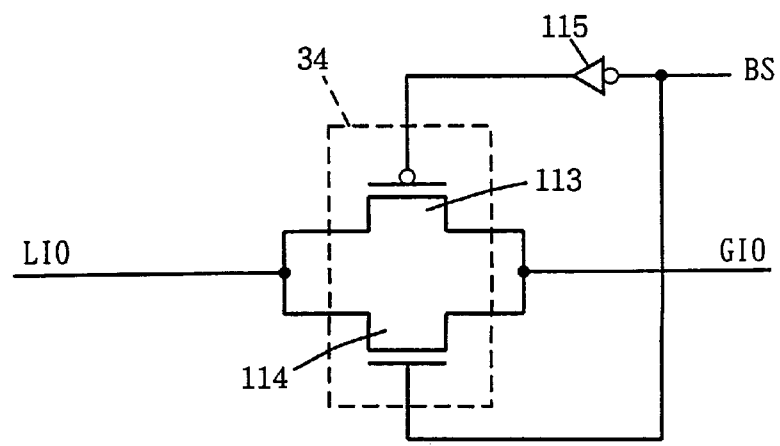
FIG. 21 shows a structure of a transfer gate 34 in the DRAM of the thirteenth embodiment.

FIG. 21 is a circuit diagram showing a structure of transfer gate 34 to connect a local input/output line LIO with a global input/output line GIO in a hierarchical I/O line structure when the voltage level of the sense amplifier power source is reduced.

Referring to FIG. 21, transfer gate 34 includes a P type transistor 113 and an N type transistor 114. N type transistor 114 and P type transistor 113 receive a subblock select signal SB and an inverted signal thereof at their gates.

Figure 31:
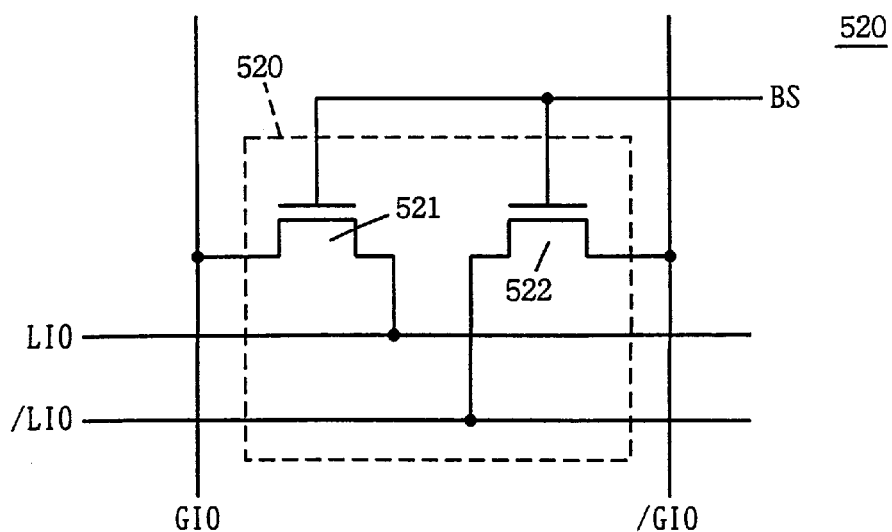
FIG. 31 shows a structure of a transfer gate 520.
Figure 32:
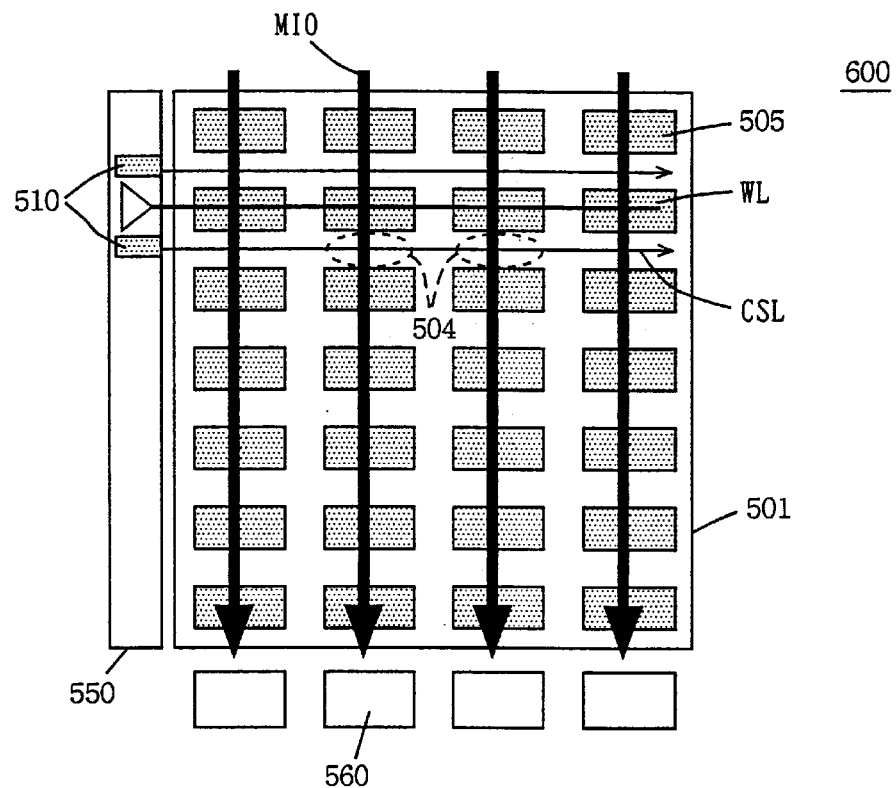
FIG. 32 schematically shows a structure of a DRAM 600 of the multi-bit system.
Figure 33:
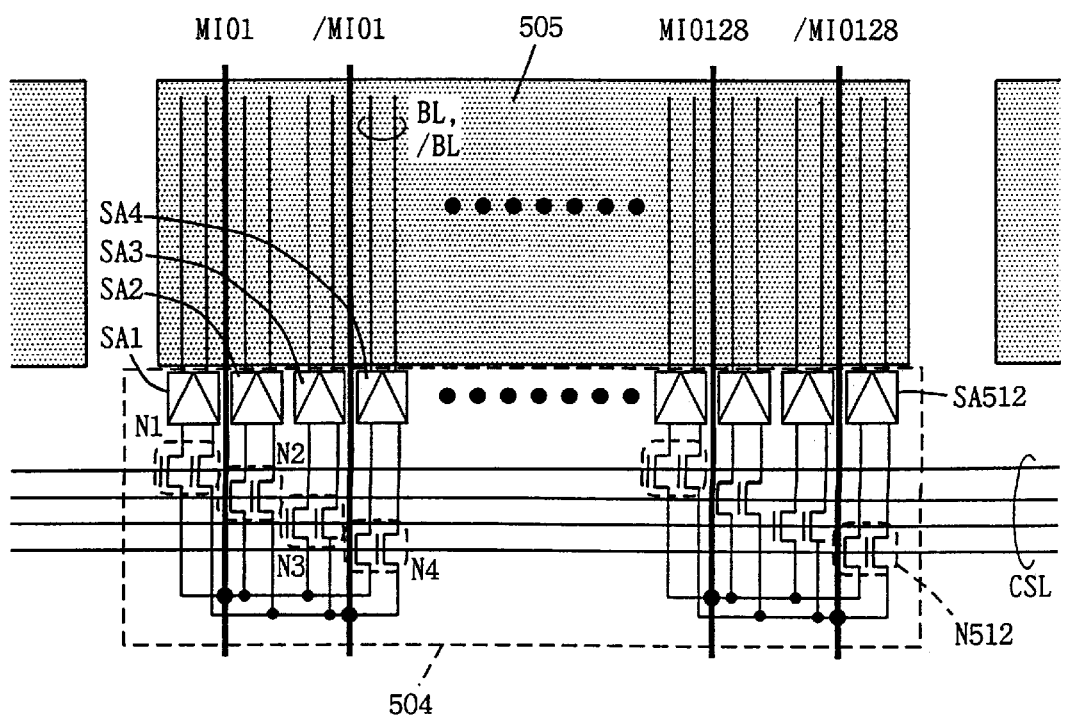
FIG. 33 is a schematic diagram for describing the connection of the I/O line and sense amplifier in DRAM 600.

In contrast to the transfer gate of FIG. 31 formed only of an N type transistor, the transfer gate of FIG. 20 is formed of a pair of a P type transistor and an N type transistor. When the voltage level of the sense amplifier power supply is reduced, the voltage level corresponding to an H level data is also reduced. Therefore, when data of an H level is to be written, a sufficient voltage level corresponding to the H level data cannot be obtained by a transfer gate formed only of an N channel transistor due to the drop of the threshold voltage of the transistor.

Thus, P type transistor 113 is used for transfer gate 34. However, there is a problem when the voltage level of the drive power supply of the write driver is set as the voltage level of the drive power source of a peripheral circuit that is higher than the voltage level of a sense amplifier power source as in the conventional case.

Figure 22:
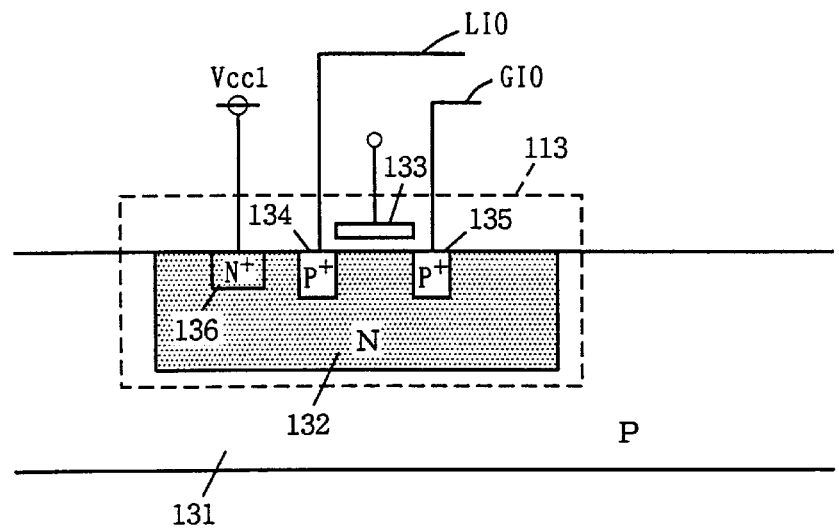
FIG. 22 is a diagram to describe the problem in a P type transistor 113 in transfer gate 34.

FIG. 22 is a schematic diagram to describe the problem of P type transistor 113 in transfer gate 34. FIG. 22 shows a structure of P type transistor 113 connected between global input/output line GIO and a local input/output line LIO.

Referring to FIG. 22, P type transistor 113 includes one of source drain 134 connected to local input/output LIO, and the other source drain 135 connected to global input/output line GIO. When P channel transistor 113 transmits data of an H level, voltages of different levels will be applied to local input/output line LIO and global input/output line GIO connected to the drain and source.

Since transfer gate 34 is provided for each subblock, it is desirable from the layout aspect to provide the transfer gate in a region adjacent to the subblock such as the region of the sense amplifier band or the subword driver band in the memory mat in the memory mat. To this end, the voltage applied via body contact 136 to the N well forming a body region 132 is a voltage Vcc1 of the sense amplifier power supply.

However, if a power supply voltage for the peripheral circuit higher than the voltage level of the N well forming the body region of the P+type source/drain region of P transistor 113 is applied by the write operation through write driver 23 via global input/output line GIO, a PN junction will be formed between source/drain 135 and body 132 to cause a current flow. This current results in extra current consumption. Also, when the amount of current increases, a bipolar operation may be induced by the parasitic transistor to cause memory error.

This problem is solved by setting the power supply voltage level of write driver 23 equal to the voltage level of the sense amplifier power supply.

Figure 23:
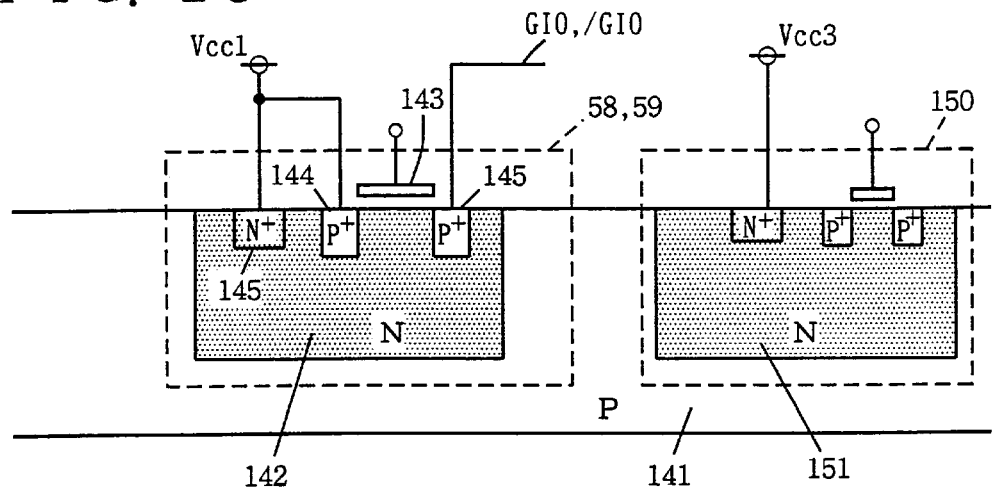
FIG. 23 shows a structure of P type transistors 58 and 59 in write driver 23 of the DRAM of the thirteenth embodiment.

FIG. 23 shows the structure of P type transistors 58 and 59 in write driver 23 of the DRAM of the thirteenth embodiment.

In the thirteenth embodiment, the level of the power supply voltage to source 144 of P type transistors 58 and 59 in write driver 23 is set, not to the level of the power supply voltage Vcc3 common to the peripheral circuit, but to a lower level of voltage Vcc 1 of the sense amplifier power supply.

Since write driver 23 is generally designed outside the memory cell array as a peripheral circuit, P type transistors 58 and 59 cannot be provided in the N type well common to the other P type transistor 150 in order to drive P type transistors 58 and 59 by the sense amplifier power supply. In other words, body region 142 of P type transistors 58 and 59 must be electrically insulated from body region 151 of other transistors.

Since write driver 23 writes data of an H level by P type transistors 58 and 59 of the above-described structure, the H level on global input/output line pair GIO, /GIO connected to drain 145 is pulled up to the voltage level of the sense amplifier power supply. Therefore, the difference in voltage with the H level data on local input/output line pair LIO, /LIO is eliminated. Therefore, the above problem will not occur.

In forming a write driver, the voltage level of the power supply driving other elements such as inverters 111, 112, NAND gates 53, 53 and inverters 50, 51 is not particularly limited.

It is to be noted that there is the disadvantage of the area being increased in order to provide independently the above N type well for insulation.

If there is margin in the layout, a structure in which only P type transistors 58 and 59 directly corresponding to data writing are driven by the sense amplifier power source can be provided. However, the layout can be made more efficient by a structure in which the entire circuit elements of the write driver are driven by the memory cell array power supply as shown in FIG. 21.

Figure 24:
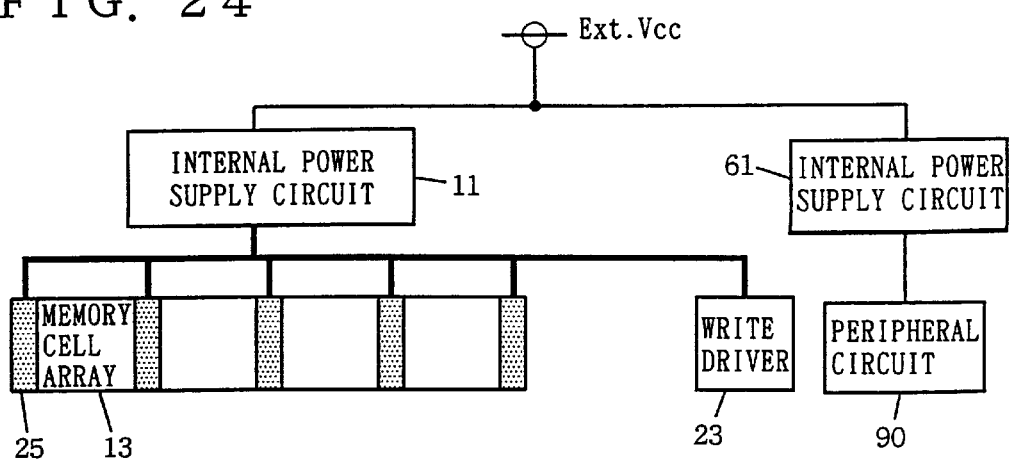
FIG. 24 is a block diagram showing the power supply system of the DRAM of the thirteenth embodiment.

FIG. 24 is a block diagram showing the power supply system in the DRAM to set the voltage level of the drive power supply of write driver 23 identical to the voltage level of the sense amplifier power supply.

Referring to FIG. 24, an internal power supply circuit 11 supplies power supply voltage to memory cell array 13, sense amplifier 25, and write driver 23. Accordingly, the level of the power supply voltage driving write driver 23 can be set equal to the voltage level of the memory cell array power supply.

Power supply voltage is provided to peripheral circuit 90 by another independent internal power supply circuit 61. From the standpoint of increasing the operation speed of the logic circuitry, the power supply voltage to peripheral circuit 90 is set higher than the power supply voltage of the sense amplifier power supply.

Fourteenth Embodiment

The fourteenth embodiment of the present invention is directed to a power supply system to suppress the adverse effect caused by increase in current consumption of the write driver due to increase of the internal bus width, in addition to the structure of the thirteenth embodiment.

In the fourteenth embodiment, the power supply driving the write driver is provided independent of the power supply for the sense amplifier. Also, a voltage balance circuit is provided to set the power supply voltage of the write driver equal to the power supply voltage of the sense amplifier.

Figure 25:
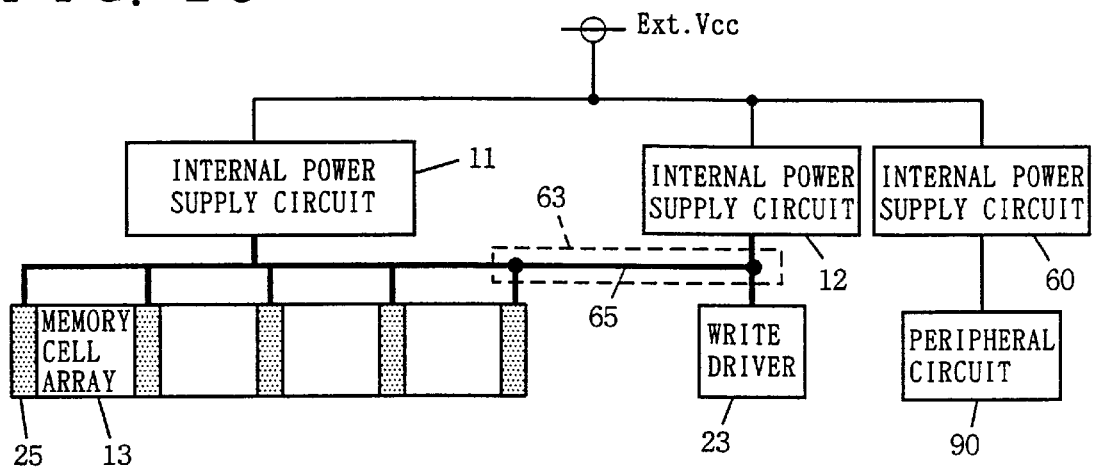
FIG. 25 is a block diagram showing the power supply system of a DRAM according to a fourteenth embodiment of the present invention.

FIG. 25 is a block diagram showing the power supply system in a DRAM according to the fourteenth embodiment of the present invention. Referring to FIG. 25, an internal power supply circuit 12 is further provided in addition to the structure of FIG. 24. Also, a power supply line 65 is provided as a voltage balance circuit 63 to connect the power supply node of internal power supply circuit 11 with the power supply node of internal power supply circuit 12, whereby the voltage level of both power supply nodes are maintained at the same level. Therefore, write driver 23 is driven by a voltage of a level identical to the voltage level of the sense amplifier power supply. The supply of the power supply voltage to peripheral circuit 60 is as described with reference to FIG. 24.

Figure 26:
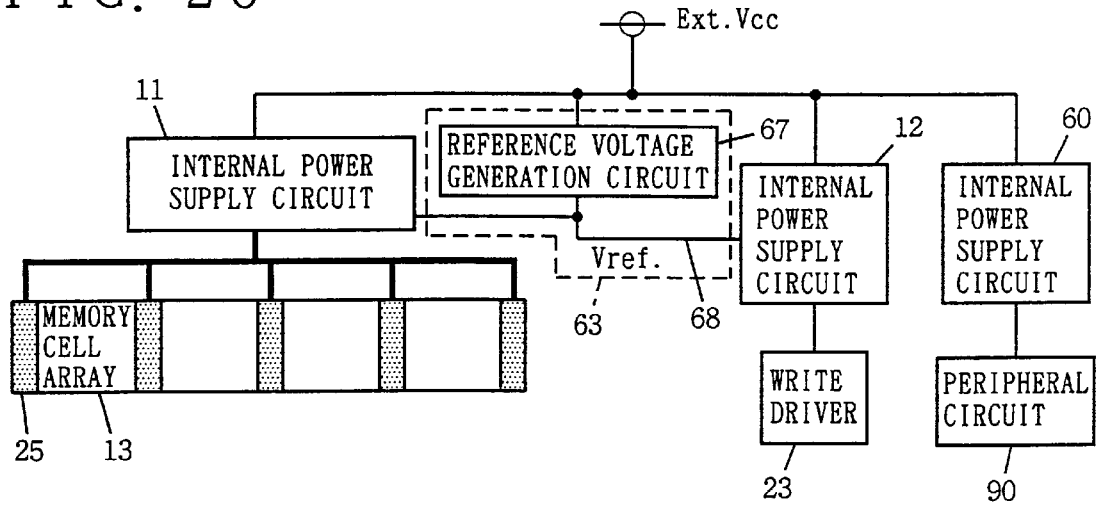
FIG. 26 is a block diagram showing the power system of another example of the DRAM of the fourteenth embodiment.
Figure 27:
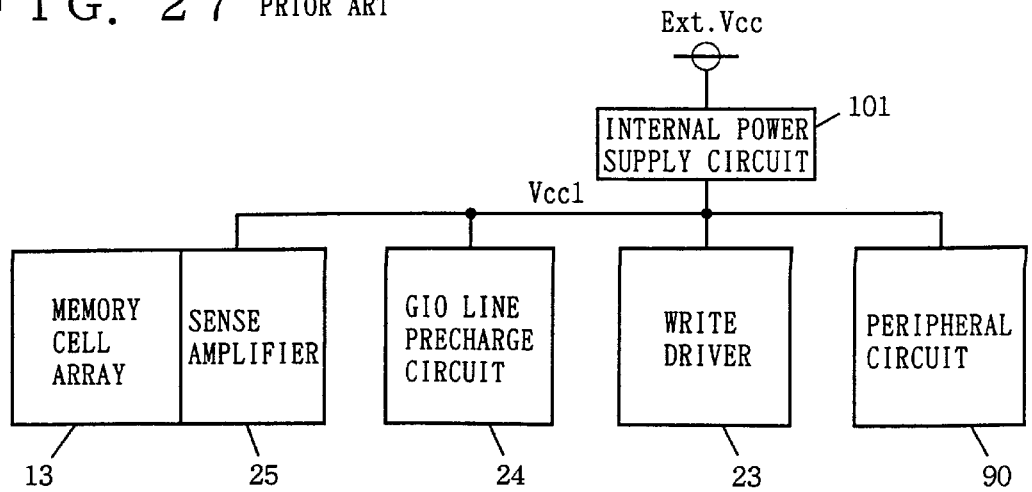
FIG. 27 is a block diagram showing an example of a power supply system in a conventional DRAM.
Figure 28:
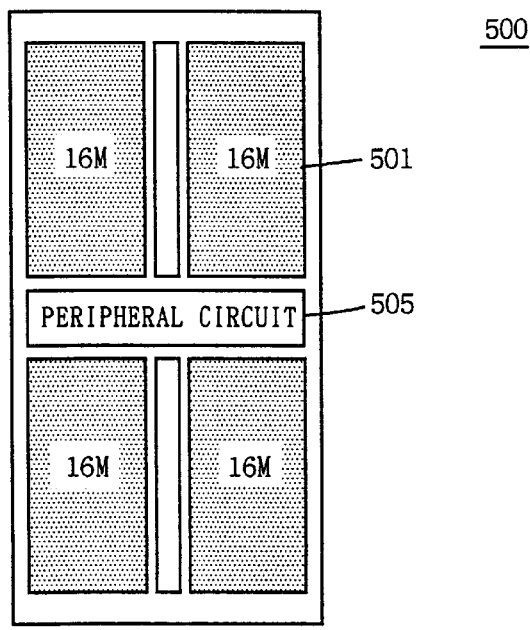
FIG. 28 shows an entire structure of a DRAM 500 of a hierarchical I/O line structure.
Figure 29:
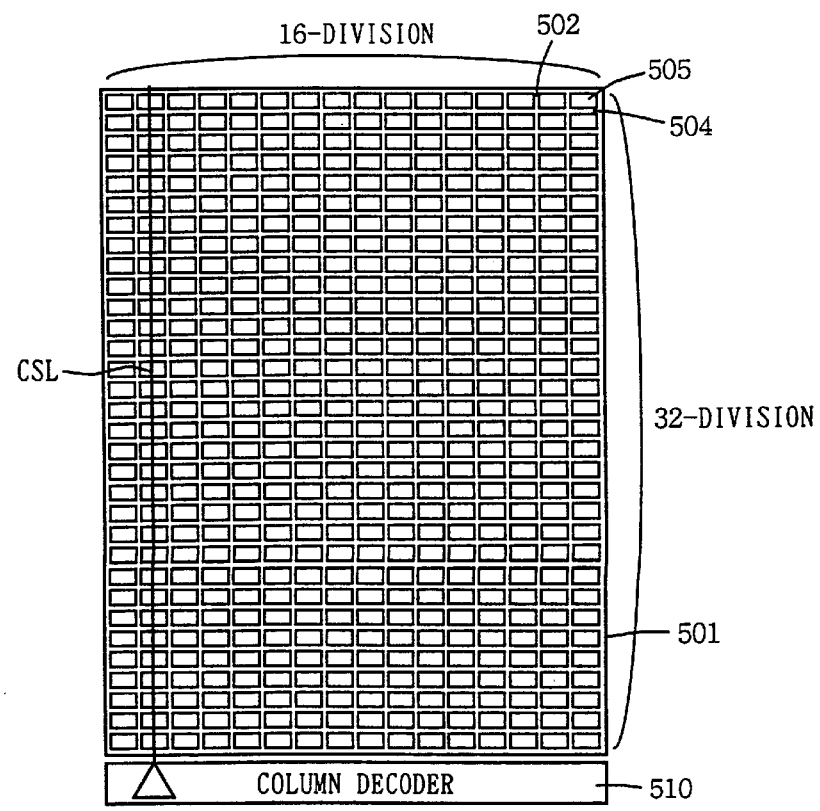
FIG. 29 shows in detail a structure of a memory mat 501 of DRAM 500.
Figure 30:
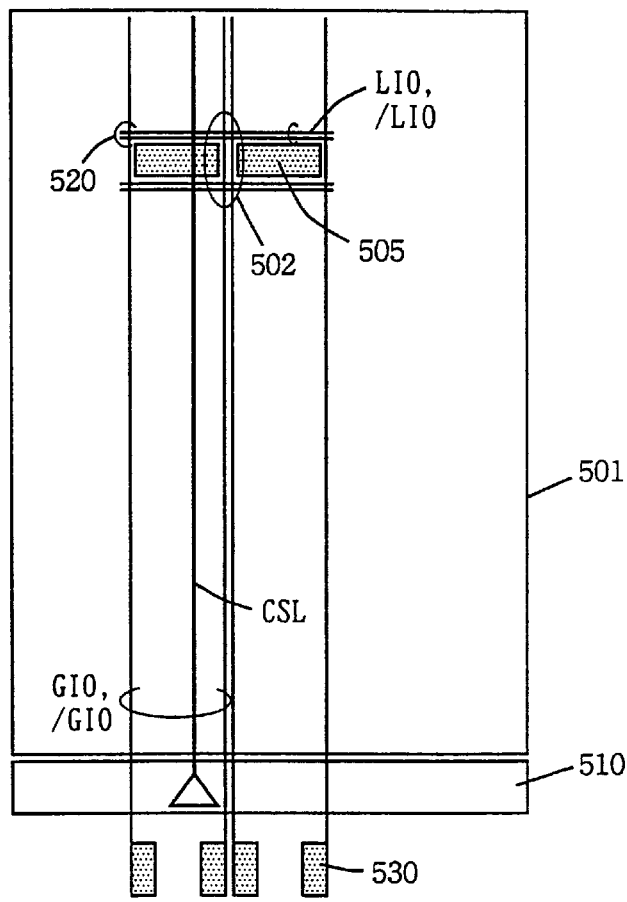
FIG. 30 is a schematic diagram for describing column selection and data transmission in DRAM 500.

FIG. 26 shows another structure of a power supply system in the DRAM of the fourteenth embodiment.

Referring to FIG. 26, internal power supply circuit 12 is provided as a power supply independent to write driver 23. Also, a reference voltage generation circuit 67 and a Vref signal line 68 are provided as a voltage balance circuit 63 that sets equal the level of the voltages generated by internal power supply circuits 11 and 12. Reference voltage generation circuit 67 receives external power supply voltage Ext.Vcc to generate a reference voltage Vref. that is applied common to internal power supply circuits 11 and 12. Internal power supply circuits 11 and 12 supply a voltage of the same level to memory cell array 13, sense amplifier 25 and write driver 23 according to reference voltage Vref. The supply of a power supply voltage to peripheral circuit 60 is as described with reference to FIG. 22.

By virtue of the power supply system of the fourteenth embodiment of FIGS. 25 and 26, the influence of the noise generated according to increase of current consumption in the write driver caused by a greater internal bus width and variation in the power supply voltage level on other circuits can be reduced. Therefore, the operation of the entire semiconductor integrated circuit device can be made stable.

The present invention is not limited to the structure of the thirteenth and fourteenth embodiments in which power supply voltage is applied to peripheral circuit 90 from an independent internal power supply circuit 61. More specifically, a structure can be implemented in which peripheral circuit 90 is directly driven by an external power supply voltage ext.Vcc.

Recently, a method of switching the voltage level of the sense amplifier power supply at a certain timing has been proposed to speed up the operation. The present invention is applicable under such a method. According to this method, a structure that can switch the voltage level of the sense amplifier power supply between a first S/A voltage level corresponding to data of an H level and a second S/A voltage level higher than the first S/A voltage level is employed. The precharge operation after a writing or reading operation is initiated by the supply of the second S/A voltage level to improve the operation speed by reducing the precharge time.

According to this structure, the advantage of the present invention can be achieved by setting reference voltage Vref. applied to internal power supply circuit 12 that supplies a power supply voltage to write driver 12 equal to the first S/A voltage level corresponding to the data H level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:

a memory cell array including a plurality of memory cells arranged in rows and columns;

a first internal power supply circuit receiving an external power supply voltage and generating a first internal power supply voltage lower than said external power supply voltage;

a sense amplifier receiving said first internal power supply voltage to operate for amplifying a data signal read out from a memory cell in said memory cell array;

a second internal power supply circuit receiving said external power supply voltage and generating a second internal power supply voltage lower than said external power supply voltage;

a write driver receiving said second internal power supply voltage to operate for writing a data signal into a memory cell in said memory cell array;

a third internal power supply circuit receiving said external power supply voltage and generating a third internal power supply voltage lower than said external power supply voltage;

an address buffer receiving said third internal power supply voltage to operate for generating a row address signal and a column address signal in response to an external address signal;

a row decoder selecting a row in said memory cell array in response to said row address signal form said address buffer; and a column decoder selecting a column in said memory cell array in response to said column address signal from said address buffer.

2. A semiconductor integrated circuit device comprising:

a memory cell array including a plurality of memory cells arranged in rows and columns;

a plurality of word lines arranged in said rows;

a plurality of bit line pairs arranged in said columns;

a local input/output line pair;

a plurality of column select gates provided corresponding to said plurality of bit line pairs, each column select gate being connected between a corresponding bit line pair and said local input/output line pair;

a global input/output line pair;

a transfer gate connected between said local input/output line pair and said global input/output line pair;

a first internal power supply circuit receiving an external power supply voltage and generating a first internal power supply voltage lower than said external power supply voltage;

a sense amplifier receiving said first internal power supply voltage to operate for amplifying a data signal read out from a memory cell in said memory cell array;

a second internal power supply circuit receiving said external power supply voltage and generating a second internal power supply voltage lower than said external power supply voltage;

a write driver receiving said second internal power supply voltage to operate for writing a data signal into a memory cell in said memory cell array; and a precharge circuit receiving said second internal power supply voltage to operate for precharging said global input/output line pair.

3. A semiconductor integrated circuit device comprising:

a memory cell array including a plurality of memory cells arranged in rows and columns;

a plurality of word lines arranged in said rows;

a plurality of bit line pairs arranged in said columns;

an input/output line pair;

a plurality of column select gates provided corresponding to said plurality of bit line pairs, each column select gate being connected between a corresponding bit line pair and said input/output line pair;

a first internal power supply circuit receiving an external power supply voltage and generating a first internal power supply voltage lower than said external power supply voltage;

a sense amplifier receiving said first internal power supply voltage to operate for amplifying a data signal read out from a memory cell in said memory cell array;

a second internal power supply circuit receiving said external power supply voltage and generating a second internal power supply voltage lower than said external power supply voltage;

a write driver receiving said second internal power supply voltage to operate for writing a data signal into a memory cell in said memory cell array; and a precharge circuit receiving said second internal power supply voltage to operate for precharging said input/output line pair.

4. The semiconductor integrated circuit device according to claim 2, further comprising:

a third internal power supply means for receiving said external power supply voltage and generating a third internal power supply voltage lower than said external power supply voltage;

an address buffer receiving said third internal power supply voltage to operate for generating a row address signal and a column address signal in response to an external address signal;

a row decoder selecting a row in said memory cell array in response to a row address signal from said address buffer; and a column decoder selecting a column in said memory cell array in response to a column address signal from said address buffer.

5. The semiconductor integrated circuit device according to claim 3, further comprising:

a third internal power supply circuit for receiving said external power supply voltage and generating a third internal power supply voltage lower than said external power supply voltage;

an address buffer receiving said third internal power supply voltage to operate for generating a row address signal and a column address signal in response to an external address signal;

a row decoder selecting a row in said memory cell array in response to a row address signal from said address buffer; and a column decoder selecting a column in said memory cell array in response to a column address signal from said address buffer.

6. The semiconductor integrated circuit device according to claim 2, further comprising:

an address buffer operating by said external power supply voltage for generating a row address signal and a column address signal in response to an external address signal;

a row decoder selecting a row in said memory cell array in response to a row address signal from said address buffer; and a column decoder selecting a column in said memory cell array in response to a column address signal from said address buffer.

7. The semiconductor integrated circuit device according to claim 3, further comprising:

an address buffer operating by said external power supply voltage for generating a row address signal and a column address signal in response to an external address signal;

a row decoder selecting a row in said memory cell array in response to a row address signal from said address buffer; and a column decoder selecting a column in said memory cell array in response to a column address signal from said address buffer.

8. The semiconductor integrated circuit device according to claim 1, wherein said semiconductor integrated circuit device is a synchronous semiconductor integrated circuit device operating in synchronization with a clock signal.

9. A semiconductor integrated circuit device comprising:

a memory cell array including a plurality of memory cells arranged in rows and columns;

a first internal power supply circuit receiving an external power supply voltage and generating a first internal power supply voltage lower than said external power supply voltage;

a second internal power supply circuit receiving said external power supply voltage and generating a second internal power supply voltage lower than said external power supply voltage;

a sense amplifier receiving said first internal power supply voltage from said first internal power supply circuit to operate for amplifying a data signal read out from a memory cell in said memory cell array;

a write driver receiving said second internal power supply voltage from said second internal power supply circuit for writing a data signal into a memory cell in said memory cell array; and a voltage balance unit setting a level of said second internal power supply voltage identical to the level of said first internal power supply voltage.

10. The semiconductor integrated circuit device according to claim 9, wherein said voltage balance unit comprises a power supply line connecting an output node of said first internal power supply means with an output node of said second internal power supply means.

11. The semiconductor integrated circuit device according to claim 9, wherein said voltage balance unit further comprises a reference voltage generation circuit generating a reference voltage signal corresponding to said first internal power supply voltage, and a signal line transmitting said reference voltage signal to said first and second internal voltage circuit.

12. The semiconductor integrated circuit device according to claim 9 comprising:

a plurality of word lines arranged in said rows;

a plurality of bit line pairs arranged in said columns;

a local input/output line pair;

a plurality of column select gates provided corresponding to said plurality of bit line pairs, each column select gate being connected between a corresponding bit line pair and said local input/output line pair;

a global input/output line pair; and a transfer gate connected between said local input/output line pair and said global input/output line pair, said transfer gate including a P type MOS transistor, said P type MOS transistor including
one of a source and drain connected to one line of said local input/output line pair,
the other of the source and drain connected to one line of said global input/output line pair,
a gate receiving a select signal, and
a region right below the gate to which said first internal power supply voltage is supplied.

13. A semiconductor integrated circuit device comprising:

a memory cell array including a plurality of memory cells arranged in rows and columns;

a plurality of word lines arranged in said rows;

a plurality of bit line pairs arranged in said columns;

a first internal power supply circuit for receiving an external power supply voltage and generating a first internal power supply voltage lower than said external power supply voltage;

a sense amplifier receiving said first internal power supply voltage to operate for amplifying a data signal read out from a memory cell array;

a write driver receiving said first internal power supply voltage to operate for writing a data signal into a memory cell in said memory cell array;

a local input/output line pair and a global input/output line pair provided between said memory cell array and said write driver for transmitting said data signal;

a plurality of column select gates provided corresponding to said plurality of bit line pairs, each column select gate being connected between a corresponding bit line pair and said local input/output line pair; and a transfer gate connected between said local input/output line pair and said global input/output line pair, said transfer gate including a P type MOS transistor, said P type MOS transistor including:
one of a source and drain connected to one line of said local input/output line pair,
the other of the source and drain connected to one line of said global input/output line pair,
a gate receiving a select signal, and
a region right below the gate to which said first internal power supply voltage is supplied.

14. A semiconductor integrated circuit device comprising:

a memory cell array including a plurality of memory cells arranged in rows and columns;

a peripheral array controlling said memory cell array, wherein said peripheral array including:

a sense amplifier operating for amplifying a data signal read out from a memory cell in said memory cell array; and a write driver operating for writing a data signal into a memory cell in said memory cell array;

a first internal power supply circuit receiving an external power supply voltage and generating a first internal power supply voltage lower than said external power supply voltage, said first internal power supply circuit providing said first internal power supply voltage to said peripheral array including said sense amplifier except said write driver; and a second internal power supply circuit receiving said external power supply voltage and generating a second internal power supply voltage lower than said external power supply, said second internal power supply circuit exclusively providing said second power supply voltage to said write driver.

15. A semiconductor integrated circuit device comprising:

a memory cell array including a plurality of memory cells arranged in rows and columns;

a peripheral array controlling said memory cell array, wherein said peripheral array including:

a sense amplifier operating for amplifying a data signal read out from a memory cell in said memory cell array;

a write driver operating for writing a data signal into a memory cell in said memory cell array; and an input/output precharge circuit for precharging a data input/output line pair of said memory cell array;

a first internal power supply circuit receiving an external power supply voltage and generating a first internal power supply voltage lower than said external power supply voltage, said first internal power supply circuit providing said first internal power supply voltage to said peripheral array including said sense amplifier except said write driver and said input/output precharge circuit; and a second internal power supply circuit receiving said external power supply voltage and generating a second internal power supply voltage lower than said external power supply, said second internal power supply circuit exclusively providing said second power supply voltage to said write driver and said input/output precharge circuit.

* * * * *